United States Patent [19]

Startup et al.

[11] Patent Number: 5,365,453
[45] Date of Patent: Nov. 15, 1994

[54] SYSTEM FOR INDICATING A LOW BATTERY CONDITION

[75] Inventors: Warren W. Startup; Gregory N. Stewart, both of Austin, Tex.

[73] Assignee: Dell USA, L.P., Austin, Tex.

[21] Appl. No.: 46,428

[22] Filed: Apr. 12, 1993

Related U.S. Application Data

[63] Continuation of Ser. No. 656,262, Feb. 14, 1991, Pat. No. 5,268,845.

[51] Int. Cl.$^5$ .............................................. G06F 15/20
[52] U.S. Cl. ...................................... 364/481; 320/43; 320/48; 324/430; 340/636
[58] Field of Search .................... 320/43, 48; 324/427, 324/430; 340/636; 364/481

[56] References Cited

U.S. PATENT DOCUMENTS

| | | | |
|---|---|---|---|
| 2,864,055 | 12/1958 | Kordesch et al. | 324/427 |
| 3,946,299 | 3/1976 | Christianson et al. | 324/430 X |
| 4,743,855 | 5/1988 | Randin et al. | 324/427 X |
| 5,119,011 | 6/1992 | Lambert | 320/43 |

Primary Examiner—Edward R. Cosimano
Attorney, Agent, or Firm—James W. Huffman

[57] ABSTRACT

A system for accurately predicting impending battery failure in battery powered electronic and electrical devices. The system continually monitors changes in battery voltage responsive to load changes and calculates a ratio of the change in voltage to the change in load. When the ratio exceeds a certain threshold value, indicating that the impedance of the battery has risen to near its final value, a user warning indication is generated.

18 Claims, 5 Drawing Sheets

SYSTEM FOR INDICATING A LOW BATTERY CONDITION

CROSS REFERENCE TO RELATED APPLICATION

This application is a continuation of U.S. Pat. No. 5,268,845, issued Dec. 7, 1993, and entitled METHOD FOR DETECTING LOW BATTERY STATE WITHOUT PRECISE CALIBRATION, which is hereby incorporated by reference as if reproduced in its entirety.

TECHNICAL FIELD

The invention relates generally to systems for detecting a low battery charge state and, more specifically, to a method and apparatus for detecting a low battery charge state without precisely calibrated voltage measurements.

BACKGROUND OF THE INVENTION

Many portable electronic or electrical systems, such as personal computers, are powered by rechargeable batteries. Users generally prefer rechargeable batteries, such as Nickel Cadmium (NiCd) batteries, because of their convenience and long life. A significant difficulty encountered in connection with battery-powered devices is predicting the point at which battery capacity is nearly exhausted so that a user may be warned of impending power failure and recharge the battery (or batteries). To be effective, the power failure warning must occur early enough to enable the user to wind up present operations, but not so early as to prevent the user from taking full advantage of remaining battery capacity. While an excessively premature warning will annoy many users, a deferred warning may prevent them from performing orderly power down procedures, resulting in a disastrous loss of work.

Most conventional low battery capacity (or "end point") warning systems employ precisely adjusted voltage comparators that must be individually calibrated by the manufacturer during manufacture and again during service. Such warning systems monitor the absolute, or terminal, voltage of the battery and issue a user warning when the voltage falls below a preset voltage threshold.

The above systems have certain deficiencies. First, the actual operating voltage of batteries will vary among different manufacturers and among different lots of the same manufacturer. In the case of rechargeable batteries, the variance can be greater than the difference in voltage between a battery with half its life remaining and a battery with only a few minutes of life remaining. Further, the terminal voltage of a battery will vary greatly with variations in load, temperature and type of battery. This makes the results of conventional warning systems extremely unreliable in the face of a varying load conditions, such as a portable computer, because it is impossible to determine an exact threshold voltage below which the battery is nearing its end point. As a result, the predetermined voltage threshold must either be set very conservatively, in which case a warning will issue too far in advance when, for example, the load is initially heavy and subsequently lessens, or not conservatively enough, in which case no warning will issue at all when, for example, the load is initially light and suddenly increases. In any case, to achieve results that are even reasonably reliable, the voltage comparators must be manually calibrated by the manufacturer at the time of manufacture and again each time the unit is serviced.

Accordingly, what is needed is a method and apparatus for predicting the end of useful battery life without relying on absolute voltage or requiring precise calibration.

SUMMARY OF THE INVENTION

The foregoing problems are solved and a technical advance is achieved by method and apparatus for detecting low battery charge state without precisely calibrated measurements. In a departure from the art, a low battery charge state detection system of the present invention exploits the fact that, although the voltage of a battery remains relatively constant over the life of the battery, the internal impedance of the battery increases toward the end of its life. This increase can be detected as an increase in the change in the terminal voltage of the battery responsive to a change in the load. At periodic intervals, the detection system of the present invention monitors the change in voltage responsive to a change in the power consumption of the load and calculates the ratio of the two values. When the ratio exceeds a predetermined threshold value, a warning, such as an audible alarm or visual signal, is issued to the user.

In an illustrative embodiment, the low battery charge state detection system of the present invention includes a circuit connected to a battery supplying power to a variable load, such as a personal computer, for monitoring the operating voltage of the battery and a circuit connected to the load for measuring the current through the load. The voltage measurements are supplied to a voltage difference monitor that continuously monitors the change in voltage (delta voltage) occurring in response to a variation in the power consumption of the load at periodic intervals. The current measurements are supplied to a current difference monitor for continuously monitoring the change in current (delta current) through the load occurring in response to a change on the power consumption of the load at periodic intervals. The delta voltage and delta current are put through an analog-to-digital converter and input to a microcontroller which computes the ratio of the delta voltage to the corresponding delta current and compares the ratio to characteristic data of a power source identical to the battery which is near failure. When the ratio exceeds a predetermined threshold value, indicating that the internal impedance of the battery is nearing its final value, a user alarm is activated to alert the user of impending power failure.

In one embodiment, the change in the power consumption of the load is caused by natural variations in the load. In an alternative embodiment, the system includes a switch for periodically disconnecting the load from the battery and connecting it to an alternative power source, for example, a second battery so that the change in battery voltage resulting therefrom can be measured. In this manner, the change in load power consumption can be artificially effected.

In another embodiment, a switch circuit is provided for alternatively electrically disconnecting a first battery from the load when the battery becomes discharged, and electrically connecting a second charged battery to the load. In this embodiment, when the above ratio exceeds the predetermined threshold value, a control signal is issued from the microcontroller to the switch, causing the switch to disconnect the first battery from the load and connect the second battery thereto.

A technical advantage achieved with the invention is that it eliminates the need for expensive voltage comparators in predicting battery failure.

A further technical advantage achieved with the invention is that it provides a more reliable and accurate prediction of battery failure than conventional end point wanting systems, especially in situations involving widely varying loads, such as a portable personal computer.

A further technical advantage achieved with the invention is the elimination of the need for precisely calibrated voltage measurement circuitry used in conventional end point detection methods. With the present invention, given enough resolution in the measuring circuitry, the end point can be determined without using precisely calibrated terminal voltage measurements.

DESCRIPTION OF THE PREFERRED EMBODIMENT

Figure 1:
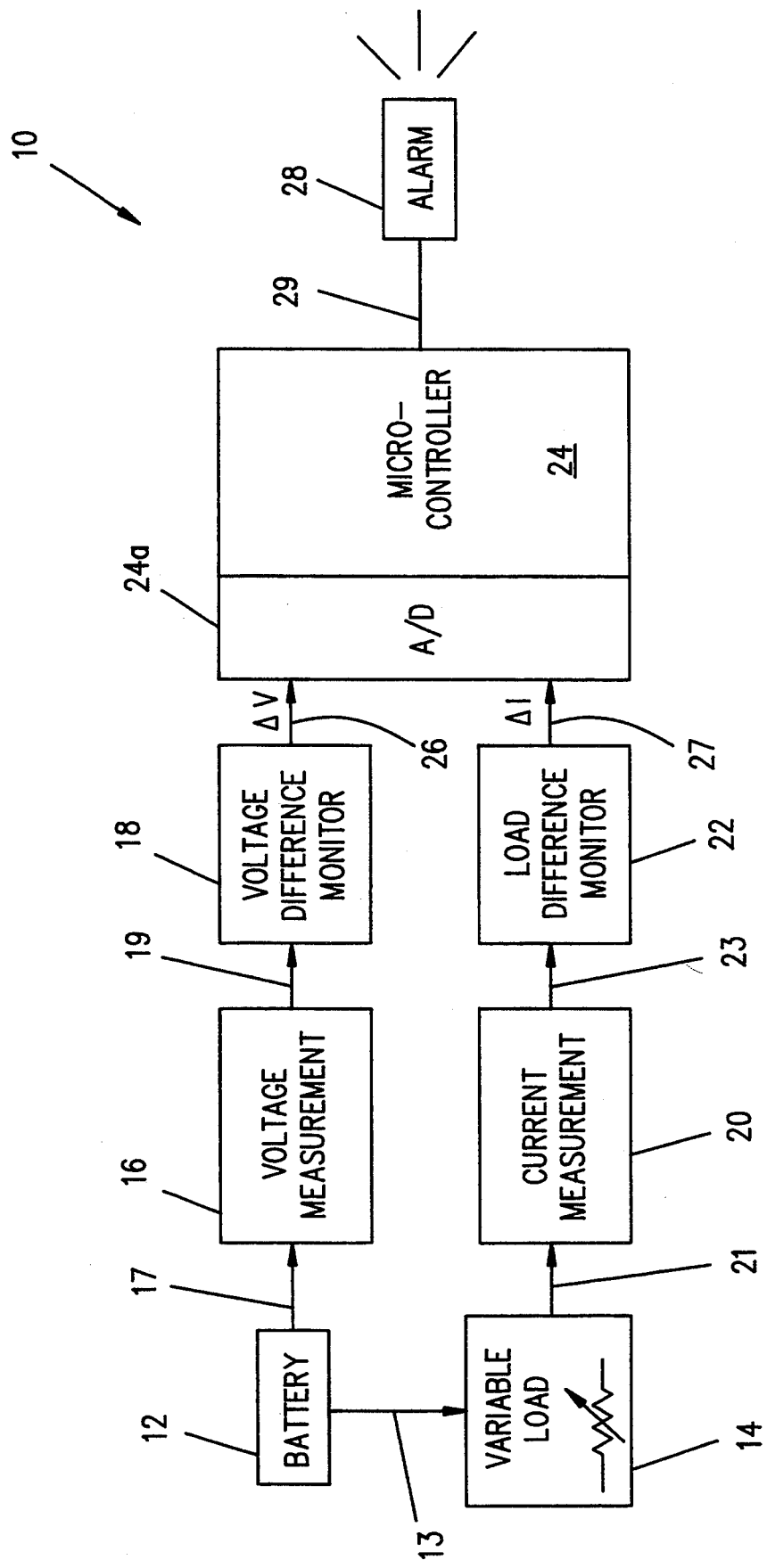
FIG. 1 is a block diagram of a low battery charge state detection system embodying features of the present invention.

In FIG. 1, the reference numeral 10 designates a low battery state detection system of the present invention. The system 10 comprises a battery 12 which is operably connected for supplying power to a variable load 14, which may be, for example, a portable personal computer, via a line 13. It is understood that the battery 12 may comprise a single battery or one or more banks of batteries.

A voltage measurement device 16, such as a voltmeter, is connected to the battery 12 via a line 17 for measuring the operating voltage of the battery 12. The device 16 is further connected, via a line 19, to a voltage difference monitor 18. The voltage difference monitor 18 continuously monitors the change in the operating voltage (delta voltage) of the battery 12 at periodic intervals occurring responsive to a change in the power consumption of the load 14.

A current measurement device 20 is connected to the load 14 via a line 21 for measuring the current through the load 14. The measurement device 20 is further connected, via a line 23, to a load difference monitor 22 which continuously monitors the change in the current (delta current) through the load 14 occurring responsive to a change in the power consumption of the load 14 at periodic intervals.

The delta voltage and the corresponding delta current are input to a microcontroller 24 through an analog-to-digital (A/D) converter 24a via lines 26 and 27, respectively. (Software that is executed on the microcontroller 24 is attached hereto in Appendix A). The A/D converter 24a converts the delta voltage and delta current signals output by the devices 18 and 22 into digital signals to be processed by the microcontroller 24. The microcontroller 24 calculates a ratio of the delta voltage to the delta current and compares the ratio to characteristic data of a power source identical to the battery 12 which is about to fail, it being understood that such characteristic data may be stored in memory means (not shown) connected to the microcontroller 24. It is understood that the above ratio represents the impedance of the battery 12. This impedance has been observed to increase near the end of the useful life of a battery.

The microcontroller 24 is further connected to a user alarm 28, which may be an audible or visual indicator, via a line 29. When the above ratio exceeds a predetermined threshold value, indicating that the internal impedance of the battery has risen to near its final value, the user alarm 28 issues a warning to the user to alert the user of impending power failure. The threshold value is selected based upon research of batteries similar to the battery 12 under similar conditions. The threshold value is chosen to indicate a selected safe time period just prior to battery 12 failure to enable a user to complete use of the load before such failure occurs. In one embodiment, it is contemplated that the battery 12 comprises more than one battery bank (not shown), and when failure is imminent, the microcontroller 24 switches the load from the failing bank to another bank.

Figure 2A:
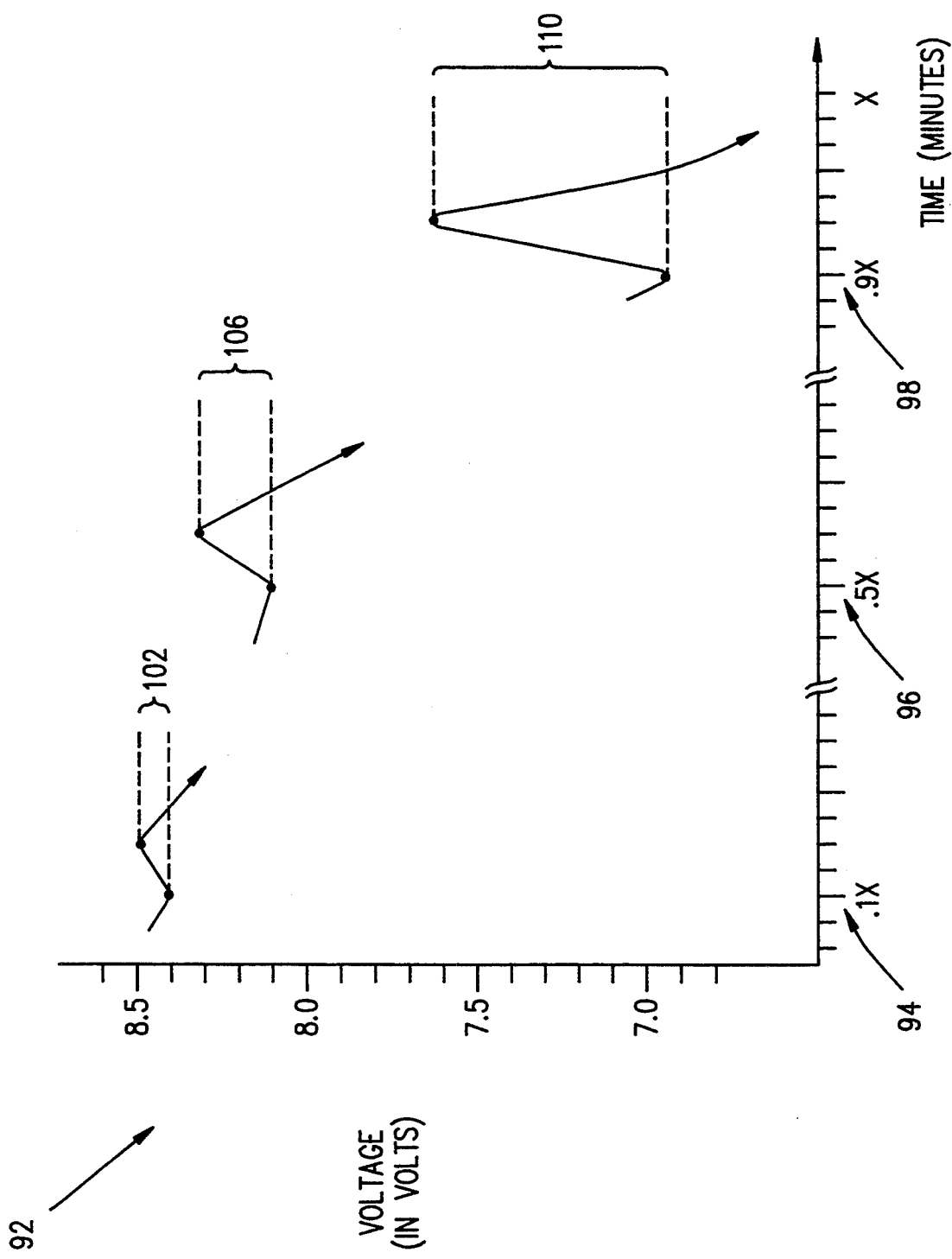
FIGS. 2A and 2B are graphical timing diagrams which show the changes in battery voltage responsive to changes in load current over the life of the battery.
Figure 2B:
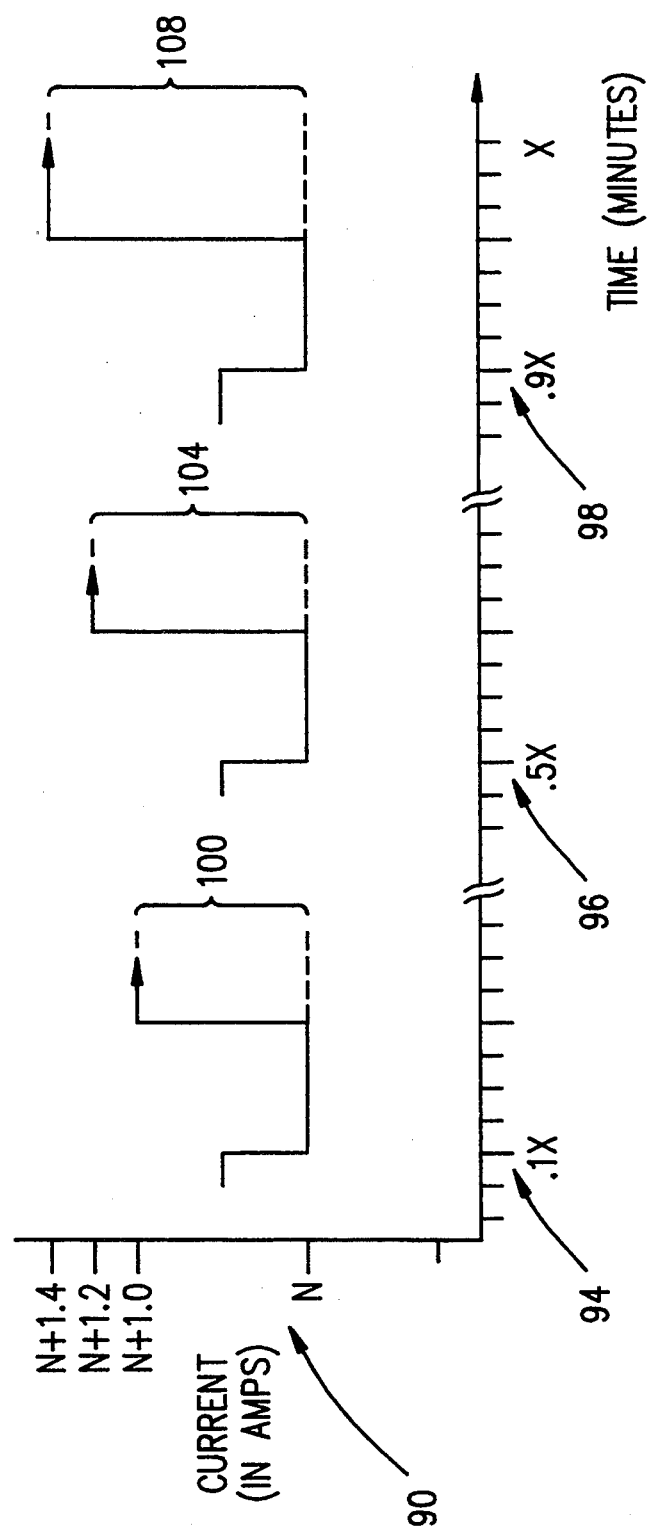

Referring to FIGS. 2A and 2B, timing diagrams 90 and 92 respectively illustrate a delta current and a delta voltage responsive to a change in the power consumption of the load 14 at three different points during the life of the battery 12. It is understood that the values presented in the diagrams 90 and 92 are approximations only and that the actual values will vary depending upon the individual battery 12 and the identity of the load 14. The point X on the x-axes of the diagrams 90 and 92 represents the total capacity of the battery 12 in watt-hours. At a point 94, when the battery 12 is ten percent depleted (represented on the x-axis as "0.1X"), a 1 amp delta current 100 (represented on the y-axis as "N+1.0") causes a 0.1 volt delta voltage 102, for a delta voltage to delta current ratio of 0.1. At a point 96, when the battery 12 is fifty percent depleted ("0.5X"), a 1.2 amp delta current 104 ("N+1.2") causes a 0.2 volt delta voltage 106, for a delta voltage to delta current ratio of 0.167. At a point 98, when the battery is ninety percent depleted ("O.9X"), a 1.4 amp delta current 108 ("N+1.4") causes a 0.6 volt delta voltage 110, for a delta voltage to delta current ratio of 0.428.

It is apparent from FIGS. 2A and 2B that the internal impedance of the battery 12 increases steadily toward the end of its life, as indicated by the increasing delta voltage to delta current ratio. As previously described, the microcontroller 24 continuously computes this ratio and when the ratio exceeds a certain threshold value, as determined from characteristic data of a power source similar to the battery 12 at the point at which it is about to fail, the user alarm 28 is activated to alert the user of the impending power failure.

Figure 3:
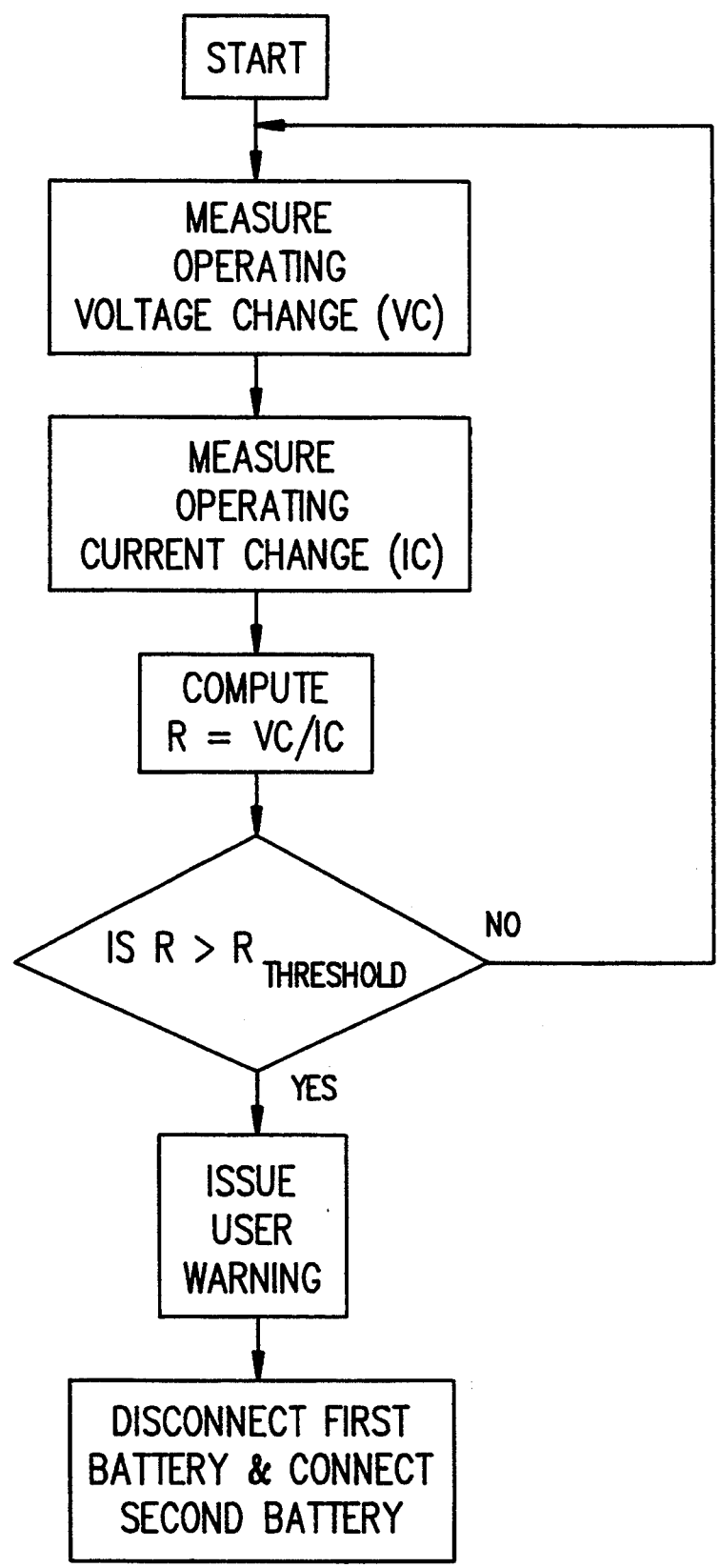
FIG. 3 is a flow chart illustrating the method of the present invention.

Referring to FIG. 3, a flow chart is shown which illustrates a method of the present invention, as controlled by the microcontroller 24, discussed above.

Figure 4:
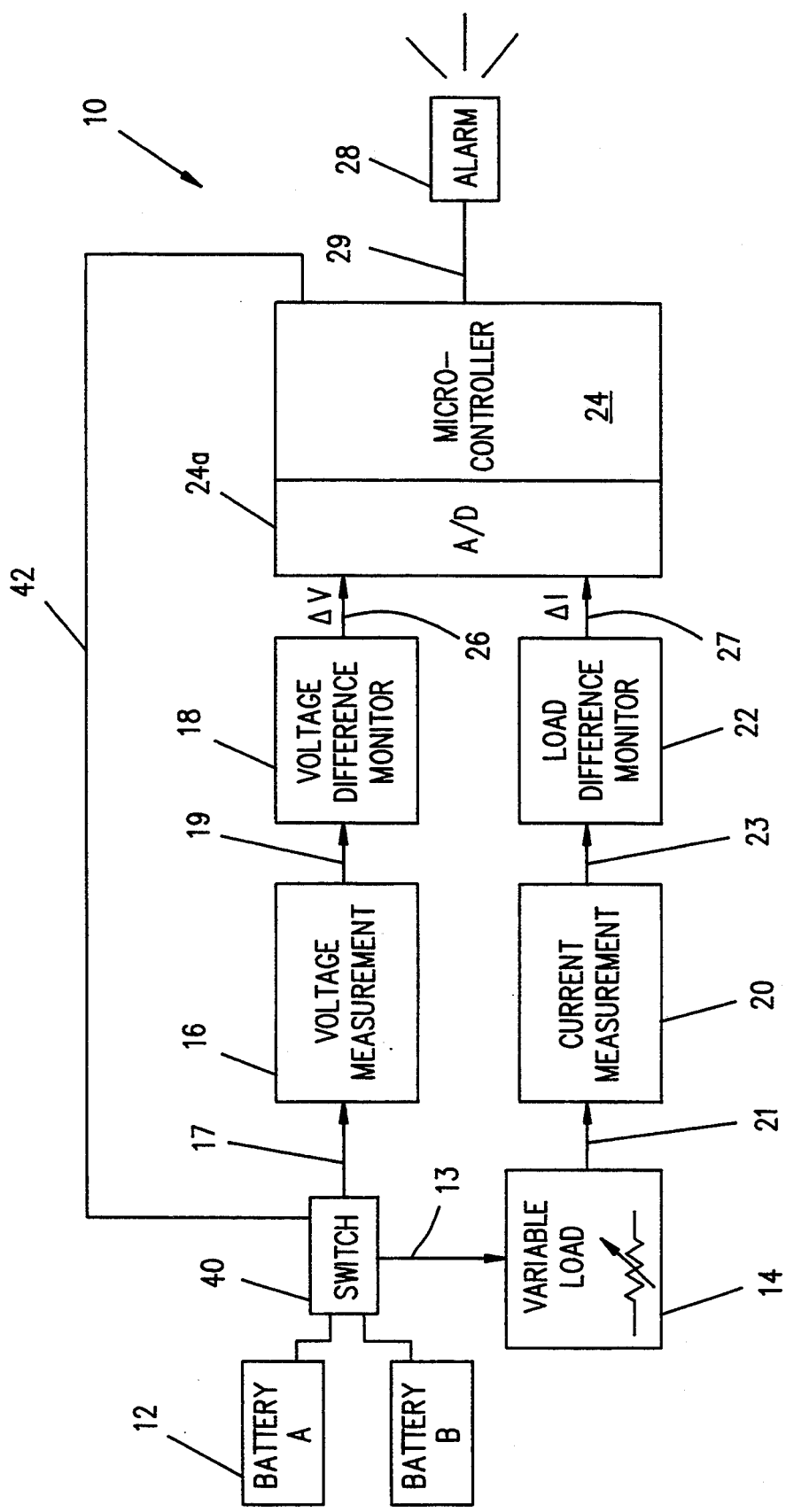
FIG. 4 is a block diagram of an alternative embodiment of a low battery charge state detection system embodying features of the present invention.

Referring to FIG. 4, an alternative embodiment of the present invention is shown. FIG. 4 is similar to the invention shown in FIG. 1, except that a switch 40 is interposed between the variable load 14 and the battery 12. In addition, a second battery is provided to allow the switch 40 to disconnect the battery 12 from the load 14 and connect the second battery to the load 14. The switch 40 is controlled by the microcontroller 24 via line 42.

Several advantages accrue from determining imminent battery failure using the present method. By comparing the ratio of delta voltage to delta current with historical data of the same for a similar power cell, precisely calibrated voltage measuring circuitry of conventional battery end point detection methods is not required. Further, the present method of tracking battery impedance enables a more accurate indication in environments where battery terminal voltage varies considerably with the load, temperature and type of battery.

It is understood that the present invention can take many forms and embodiments. The embodiments shown herein are intended to illustrate rather than to limit the invention, it being appreciated that variations may be made without departing from the spirit or the scope of the invention. For example, the invention could be implemented as a hardware device, as a software algorithm, or as a combination of hardware and software. Further, the load may comprise any device or devices requiring power. Examples include, inter alia, circuits, lighting devices and consumer electronic products such as computers, camcorders, players and portable telephones. Still further, the system 10 may be employed in electronic and electrical devices having arrangements for switching among two or more battery banks for predicting the point at which a first bank is about to fail, at which point a second bank is connected for supplying power to the load.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

APPENDIX A

```
;       NAME    APOLLO.EQU
;       TITLE   Equates for the COP

;***********************************************************************
;* Copyright (c) 1990 Dell Computer Corporation, Inc. This program     *
;* contains proprietary and confidential information. All rights reserved *
;* except as may be permitted by prior written consent.                *
;***********************************************************************

;***********************************************************************
;       Revision Information    $Revision: 1.46 $
;                               $Date:   04 Nov 1992 17:47:20 $
;***********************************************************************

; The following are register definitions second  = 0F0           ;Decremented by T0 to count 5.12msec
                                ; intervals in one second
        minute  = 0F1           ;Decremented once per second to form
                                ; 1 minute counter
        syscnt  = 0F2           ;System activity timer
        hdcnt   = 0F3           ;Hard disk activity timer, also used
                                ; in charging bank A
        lcdcnt  = 0F4           ;LCD activity counter, also used in
                                ; charging bank B
        CNT     = 0F5           ;Used for repeat count functions
        avcnst  = 0F6           ;Bank A voltage constant timer for charging
                                ; also used to control beep rate
        bvcnst  = 0F7           ;Bank B voltage constant timer for charging
                                ; also used to control beep count
        batcnt  = 0F8           ;Number of seconds to switch banks during battery
                                ; operation, also charger timeout in minutes
        tdelay  = 0F9           ;Used to provide settling time
        rtime   = 0FA           ;Run time for clock while in standby mode
```

```
    ERC     = 0FB           ;ON/OFF control to flash LED's
    pendng  = 0FF           ;register not used in COP888CF, used in APOLLO
                            ; to flag delayed operations ophigh  = 00
    oplow   = 01
    saveb   = 02
    savex   = 03
    TEMP    = 04
    batav   = 05            ;check order of battery v,c for best
    bacrg   = 06            ; arrangement ********************
    batbv   = 07
    bbcrg   = 08
    batrv   = 09
    battmp  = 0A
    batac   = 0B
    batbc   = 0C
    baimin  = 0D
    bbimin  = 0E
    avwork  = 0F
    psave   = 011
systim = psave              ;System sleep mode timeout
hdtim  = systim + 1  ;Hard disk timeout
lcdtim = hdtim  + 1  ;LCD backlight timeout
sysbyt = lcdtim + 1  ;System flags
    xsumpd = sysbyt + 1     ;Checksum of system data for power validation
    mode   = xsumpd + 1
    crgmde = mode   + 1
    flashb = crgmde + 1     ;LED flash and beeper control
    batmsc = flashb + 1     ;Miscellaneous battery flags
    restim = batmsc + 1     ;# of seconds of reserve operation
    brvmax = restim + 1     ;used by reserve battery charger
    bavmax = brvmax + 1     ;high voltage after switch
    bavmin = bavmax + 1     ;low voltage on A bat before switch
    bbvmax = bavmin + 1     ;highest voltage after switch
    bbvmin = bbvmax + 1     ;lowest voltage on B bat before switch
    alrmct = bbvmin + 1     ;number of seconds standby switch is pressed
    hdcmd  = alrmct + 1
    ckadr  = hdcmd  + 1
    ckdata = ckadr  + 1
    rsrvd1 = ckdata + 1     ;currently not used in 320N(+). for CRGMON compatibility
    lcdseq = rsrvd1 + 1     ;lcd sequencing control
    debug  = lcdseq + 1     ;debug flags register.
    rsrvd2 = debug  + 1     ;currently not used in 320N(+). for CRGMON compatibility
    initemp = rsrvd2 + 1    ;initial temp.
    avsave = initemp+ 1     ;last 8 voltage readings on the A battery
    achrge = avsave + 8     ;Last 8 charge current readings on the A batt
    bvsave = achrge + 8     ;last 8 voltage readings on the B battery
    bchrge = bvsave + 8     ;Last 8 charge current readings on the B batt
    rvsave = bchrge + 8     ;last 8 voltage readings on the Reserve batt
    transb = rvsave + 8     ;Transfer buffer ackprt  = portgp bit     6
dack    = mask
```

; Constants used in this program

```
timcnt  = 46875+256+1      ;46875 counts = 4 minutes at 8MHz clock
seccnt  = 195              ;195.3125 counts per second
min1    = 60               ;seconds in 1 minute
min4    = 240              ;240 seconds in 4 minutes (error=75=.384sec)
vterm   = 128    ;135              ;A/D calibration for 7.5v
v1cell  = 156              ;voltage @800ma with 1 cell shorted
v2cell  = 163    ;9volts   ;voltage @800ma with 2 cells shorted
v2cnmh  = 145    ;8volts   ;NiMH @800ma with 2 cells shorted
vrmin   = 194              ;194 counts = 5.298v
vrnom   = 201              ;201 counts = 5.489v
ilchrg  = 181    ;**200            ;199.85 = 800ma.
ihchrg  = 210    ;**231            ;231.07 = 925ma.
maxcrg  = 07E              ;6.25K
mindlt  = 3                ;minimum delta to allow battery switch .if     nimh
mincrg  = 07               ;trickle at 40-50ma.
deltai  = 3 ;1             ;+delta I >= 8ma
        .else
mincrg  = 0A               ;trickle at 80-100ma.
deltai  = 3                ;+delta I >= 12ma (old board is noiser
        .endif deltav  = 2                ;-delta V > 55mv.
maxv    = 214              ;saturation voltage of power supply
avcur   = 105              ;avreage current
midptv  = 150              ;mid point voltage
mxctim  = 165              ;don't charge nicad more than 2.75 hours
mxniht  = 225              ;3 hours 45 min for NiMh batt
loniht  = 58               ;Minimum NiMH temp = 32 deg F (0 C)
hiniht  = 176              ;Maximum NiMH temp = 104 deg F (40 C)
maxnih  = 230              ;Maximum temp during charge 137.6F (58.6C)
cvtimr  = 40               ;number of minutes of constant voltage
lb1dlt  = 10               ;delta V to initiate low bat 1 mode
lb1dmh  = 10               ;delta V for low bat 1 with NiMH battery
lb2dlt  = 14               ;delta for low bat 2 mode
poasec  = 1                ;number of seconds before power on alarm
beepct  = 182              ;2.2KHz = 182 clocks per 1/2 cycle
btime   = 01FFF            ;.08sec duration
flgval  = 0A5              ;initialization flag
wdval   = 0D9              ;Watch dog setting for 64K window
fulcrg  = 187              ;indication of full charge when Delta i is reached
```

; SRAM Data address assignments

```
sinitf  = 01E02    ;initial operation flag (set to A5 when sram cleared)
sresti  = 01E03    ;save address for reserve battery operation time
srescr  = 01E04    ;number of times reserve has been charged
sresdi  = 01E06    ;number of times reserve switched in
dmy008  = 01E08
dmy009  = 01E09
dmy00A  = 01E0A
```

```
dmy00B = 01E0B
dmy00C = 01E0C
dmy00D = 01E0D
dmy00E = 01E0E
dmy00F = 01E0F
dmy010 = 01E10
dmy011 = 01E11
dmy012 = 01E12
dmy013 = 01E13
dmy014 = 01E14
dmy015 = 01E15
dmy016 = 01E16
dmy017 = 01E17
dmy018 = 01E18
dmy019 = 01E19
dmy01A = 01E1A
dmy01B = 01E1B
dmy01C = 01E1C
dmy01D = 01E1D
dmy01E = 01E1E
dmy01F = 01E1F
dmy020 = 01E20
dmy021 = 01E21
dmy022 = 01E22
dmy023 = 01E23
dmy024 = 01E24
dmy025 = 01E25
dmy026 = 01E26
dmy027 = 01E27
dmy028 = 01E28

; MILES OP pin assignments
;
;   OP Low byte bit     0
        drq5    = mask          ;output to AT DMA controller bit     1
        master  = mask          ;output to AT bus MASTER* bit     2
        lcdon   = mask          ;signal to inverter pcb module (Vee)

bit     3
        csclr   = mask          ;clears chip select latch when 0 bit     4
        bankb   = mask          ;Select battery A or B bit     5
        lowbat  = mask          ;light low battery LED bit     6
        chrgrb  = mask          ;charges the reserve battery when high
```

```
        bit     7
        vddon   = mask           ;turns on Vdd to LCD when high
```

; OP High byte

```
        bit     8
        ampson  = mask           ;Turn on power to opamps bit     9
        dcoff   = mask           ;active high pulse kills system power bit     10
        speakr  = mask           ;output to speaker from uController bit     11
        pd9020  = mask           ;wakeup pin on 90C20 bit     12
        fetoff  = mask           ;1 turns off system switch bypass transistor bit     13
        hispd   = mask           ;output to HT21 1-> proclock=1/2 clkx2 bit     14
        a14     = mask           ;A14 bank swap pin for uController SRAM bit     15
        iom     = mask           ;If high exception cycle is I/O, low memory
```

; Port L bit assignments

```
        bit     2
        bdt     = mask           ;Battery Detect interrupt low when installed bit     3
        hdcs0   = mask           ;IDE chip select bit     4
        chrga   = mask           ;Bank_A PWM charge control bit     5
        cpuint  = mask           ;CPU interrupt line input bit     6
        kbdint  = mask           ;Keyboard interrupt bit     7
        vramcs  = mask           ;Video ram chip select
```

; Port G bit assignments

```
        bit     0
        ucint   = mask           ;Signal from MILES when CSTAT is cleared
```

```
    bit     1
    wdout   = mask        ;Watch dog timer output bit     2
    syson   = mask        ;High if system switch on bit     3
    chrgb   = mask        ;Bank_B PWM charge control bit     4
    swx     = mask        ;Low true Standby Switch Pressed bit     5
    ioact   = mask        ;Floppy, ser, print, or IRQ8 active bit     6
    dack5   = mask        ;DMA ack from CPU to allow uC to access bus bit     7
    spareg  = mask        ;Spare I/O ; Timer on/off control bit bit     4
    txc0    = mask        ;Same bit position for both timers ; Port C bit assignments bit     0
    milsad  = mask        ;Address strobe for MILES OP registers bit     1
    milstb  = mask        ;Strobe bit for MILES OP registers bit     2
    crgled  = mask        ;When low lights charge led bit     3
    rbin    = mask        ;When low reserve battery is enabled bit     4
    pwrled  = mask        ;Low lights power LED bit     5
    rfresh  = mask        ;Low outputs refresh pulse to bus bit     6
    nimhd   = mask        ;Low indicates Ni Metal Hydride battery bit     7
    acav    = mask        ;Low indicates AC available
```

```
; MODE byte definitions bit     0
        hldreq  = mask          ;Set when system in hold bit     1
        slpmde  = mask          ;Set when in sleep mode ;       bdt     = bit 2         ;Battery detect - high when battery removed bit     3
        lobat1  = mask          ;Indicator that system is in low bat 1 mode bit     4
        lobat2  = mask          ;Indicator that system is in low bat 2 mode bit     5
        lobat3  = mask          ;Indicator that system is about to shutoff bit     6
        notrkl  = mask          ;Flag to disable trickle charge bit     7
        crgdly  = mask          ;1 to indicate start of charge cycle ; CRGMDE charge mode byte definitions bit     0
        trklec  = mask          ;trickle charge active bit     1
        camax   = mask          ;reached maximum on bank a bit     2
        cbmax   = mask          ;reached maximum on bank b ;       chrgb   = bit 3         ;Bank_B charging ;       chrga   = bit 4         ;Bank_A charging ;       cpuint  = bit 5         ;set when Timer interrupt active ;       chrgrb  = bit 6         ;Set when the reserve battery is charging bit     7
        charge  = mask          ;Set when charger active ; BATMSC miscellaneous battery flag definitions bit     0
        cngben  = mask          ;Set if battery bank switch enabled bit     1
        cngoff  = mask          ;Turn off Rbat after bank change
```

```
        bit     2
        apwmup = mask           ;Bat A PWM 1 = increment, 0 = decrement bit     3
        bpwmup = mask           ;Bat B PWM 1 = increment, 0 = decrement bit     4
        initdc  = mask          ;set during initial discharge cycle bit     5
        chrged  = mask          ;set if battery has been charged bit     6
        nihdet  = mask          ;set if NiMH battery detected bit     7
        adfail  = mask          ;set if OP amp latchup is detected ; FLASHB  Flash and beep control byte definitions bit     0
        poa     = mask          ;Power on Alarm set when case closed bit     1
        poabep  = mask          ;Audiable alarm flag ;       syson   = bit 2         ;High if system switch on bit     3
        lb1bep  = mask          ;High to enable beep for low bat 1 bit     4
        blinkc  = mask          ;High to enable blinking the charge LED bit     5
        stdeb1  = mask          ;set to debounce standby button bit     6
        stdeb2  = mask          ;2nd debounce bit bit     7
        crton   = mask          ;1 if CRT active ; LCDSEQ  Control byte for LCD power sequencing operations bit     0 bit     1
        cycdly  = mask          ;power cycle delay in progress bit     2
        dlycdn  = mask bit     3
        sync    = mask          ;used to synchronize lcd timing
```

```
        bit     4
        hdpnd   = mask          ;when set HD access is pending bit     5
        onetik  = mask          ;when set do 1 timer tick delay bit     6
        seqoff  = mask          ;set to signal backlight off sequence bit     7
        seqon   = mask          ;set to signal backlight on sequence
```

; SYSBYT System byte definitions

```
        bit     0
        syssec  = mask          ;1 if system timeout in seconds bit     1
        hdsec   = mask          ;1 if hard disk timeout in seconds bit     2
        lcdsec  = mask          ;1 if Display timeout in seconds bit     3
        acovrd  = mask          ;1 if AC override enabled bit     4
        stbyen  = mask          ;1 if standby button is enabled bit     5
        s386    = mask          ;1 if 386 host, 0 if 286 bit     6
        flshmd  = mask          ;1 if flash programming mode enabled bit     7
        pmflg   = mask          ;1 if COP not allowed to access bus
```

; DEBUG bit flags

```
        bit     0
        cet     = mask          ;get snapshot of charge end test bit     1
        act     = mask          ;snapshot of adjust charge decision bit     2
        lbt     = mask          ;snapshot of low bat test bit     3
        lb1a    = mask          ;low bat 1 on bank A
```

```
        bit     4
        lb1b    = mask          ;low bat 1 on bank B bit     5
        lb2a    = mask          ;low bat 2 on bank A bit     6
        lb2b    = mask          ;low bat 2 on bank B bit     7
```

; Switch status byte

;       Bit  0 = 1 if in Low Bat 2 mode
;       Bit  1 = 1 if in Low Bat 3 mode
;       Bit  2 = 1 if the Main Battery is installed
;       Bit  3 = 1 if bank B is selected, 0 for bank A
;       Bit  4 = 1 if Standby Button is currently pressed
;       Bit  5 = 1 if in Low Bat 1 mode

```
        bit     6
;       nimhd   = mask          ;Low indicates Ni Metal Hydride battery
```

;       Bit  7 = 1 if AC power is present

;       NAME PWRMGMT.MAC

;*********************************************************************
;* Copyright (c) 1990, 1991 Dell Computer Corporation, Inc. This program *
;* contains proprietary and confidential information. All rights reserved *
;* except as may be permitted by prior written consent.                *
;*********************************************************************

;*********************************************************************
;       Revision Information       $Revision: 1.80 $
;                                  $Date:    10 Nov 1992 13:59:04 $
;*********************************************************************

;
; This program uses the Idle timer of the COP888CF for its time reference.
; At an 8MHz clock this coresponds to a resolution interval of 5.12 msec.
; (4096 counts at .8MHz per timer tick)
;

; This program begins by setting up the ports for direction and
; enabling the watch dog timer.

```
        jp      start
        .byte   'N31'
        .if     nimh
        .byte   ' NiMH'
        .else
        .byte   ' NiCd'
        .endif
```

```
Start:
        jsrl    Init
        jsrl    xsump                   ;test the validity of the current params
        ifeq    a, xsumpd
        jp      sysok ld      systim, #0              ;set default values
        ld      hdtim, #0
        ld      lcdtim, #0
        ld      sysbyt, #020
sysok:
        jsr     stmout                  ;set the initial timeouts setbit  pmflg, sysbyt           ;delay buss access until pm command
        ld      portcd, #01C            ;initial C port data
        ld      portcc, #01F            ;make C0 and C1 - C4 outputs
        ld      b, #oplow
        ld      [b], #0
        jsr     putlow
        ld      b, #ophigh
        ld      [b], #ampson+fetoff     ;Start at high speed, video off, opamps on
        jsr     puthi                   ;This is to get around powerup
                                        ; problem with MILES jsr     dely50                  ;Wait 50 msec for power to go away
        rbit    tpnd, icntrl            ;clear the T0 overflow bit
        setbit  hdcs0, wkedg            ;Look for low going edges
        jsrl    cksram                  ;check sram parameters
        jsrl    ckrbat                  ;test reserve
        bitif   syson, portgp           ;Is the power switch on?
        jp      swchon                  ; Yes, then normal start sequence
        clrbit  syson, flashb    ;**

bitif   acav, portcp            ;Next test for AC power
        jmp     spmoff                  ; Shouldn't be here if no AC ld      portcd, #01C            ;initial C port data
        ld      portcc, #017            ;make C0 - C2 outputs
        jsrl    c20off                  ;turn off video
        jsrl    stchrg                  ;start the charger
        sbit    enti, icntrl            ;enable T0 interrupt
        jmp     cmain                   ;main loop for charge
swchon:
        jsr     clrbsy                  ;try to reset bat detect bit
        bitif   acav, portcp            ;operating from AC
        jp      isbat
        jp      nstart
isbat:  bitif   bdt, portlp             ;operating from battery
        jmp     spmoff                  ;no battery or AC nstart:
        setbit  syson, flashb    ;**
        jsrl    c20on                   ;turn on video
        jsr     vinit                   ;initialize voltage readings
        jsr     dlypmd                  ;reset power monitoring mode
        ld      wkpnd, #0               ;clear any pending interrupts
        setbit  bdt, wken               ;enable battery detect interrupt
        sbit    enti, icntrl            ;enable T0 interrupt
```

```
          sbit     6, icntrl         ;enable L port wakeup interrupt
          sbit     1, psw            ; enable external interrupt
main:
          sbit     gie, psw          ;global interrupt enable
          nop                        ;service all interrupts now
          nop
          nop
          rbit     gie, psw ; now turn them back off
          bitif    flshmd, sysbyt    ;are we programming a new rom?
          jp       main              ; then loop till done
          bitif    syson, portgp     ;Monitor system switch
          jp       main00
          bitif    bdt, mode         ;are we waiting for a new battery?
          jmp      reslop            ;wait for new battery
          jmp      reset
main00:
          bitif    acav, portcp      ;test for ac available
          jp       main10            ; if operating from batteries
          bitif    notrkl, mode      ;is trickle charge enabled?
          jp       main01            ; no then don't turn on
          bitif    chrgrb, crgmde    ;if reserve battery being charged
          jp       main01            ; don't turn on trickle charger
          bitif    trklec, crgmde    ;Allow trickle charge when AC available
          jp       main01            ; if already set
          bitif    charge, crgmde    ;** remove for production
          jp       main01            ;**
          jsr      clrlob
          jsrl     trklon            ;start trickle charge
main01:
          bitif    bdt, portlp       ;test for battery presence
          jsr      clrbdt            ; and reset latch if removed
          jmp      main
main10:
          bitif    charge, crgmde
          jsrl     trklof            ;turn off the charger if no AC
          bitif    trklec, crgmde    ;only true if AC adapter just unpluged
          jsrl     trklof            ; turn off trickle charge
          bitif    bdt, mode         ;are we waiting for a new battery?
          jmp      reslop            ;wait for new battery before testing voltage
          bitif    lobat3, mode      ;are we about to shut down system?
          jmp      lo3lop            ;then wait for AC or new battery
          jmp      main              ;wait before measuring batteries locate   0                 ;make sure this is in first page
cksm00:
          laid
          ret
```

;
; The cop888cf has a vectored interrupt scheme. On an interrupt
; the program branches to the instruction at 0FFh. The program can
; then save the appropriate registers and issue a VIS instruction
; to branch to the interrupt handler.
;

```
          locate   0,0               ;make sure this is in first page

.=0ff
```

; This routine saves the contents of A, B, and X on entry to an interrupt
; and restores them on exit.

```
            push    a               ;this is the only register we can save on stack
            x       a, b            ;move contents of b to a
            ld      b, #saveb       ;point to location to save B and X
            x       a, [b+]         ;save contents of original B register
            x       a, x            ;get contents of X register
            x       a, [b]          ;and save in data ram
            vis
restor:
            ld      b, #savex       ;point to location of saved X register
            x       a, [b-]         ;get old X contents
            x       a, x            ;and put back in X
            x       a, [b]          ;now get the saved contents of B
            x       a, b            ;and put it back in B
            pop     a               ;now we're back where we started
            reti
;
; Timer T0 underflow interrupt vector
;
timer0:
            drsz    second          ;decrement seconds timer
            jp      tim00           ; and continue if not zero
            jsrl    deccnt          ;executed once every second
tim00:
            bitif   flshmd, sysbyt  ;don't check anything else if flash active
            jmp     tim04
            jsr     tstac
            bitif   syson, flashb   ;is the cpu operating
            jp      tim01
            jmp     tim04           ; if not skip standby and refresh
tim01:
            bitif   drq5, oplow     ;test for cpu in hold
            jsr     refrsh          ; and do refresh if so
            bitif   hldreq, mode    ;are we in standby mode
            jsrl    flashp          ; then flash the power led
            bitif   lobat2, mode    ;is the battery low
            jsrl    flshlb          ; then flash the low bat led
            ld      a, lcdseq       ;prepare to test flags
            ifne    a, #0           ; are any of them set?
            jsrl    sequen          ; then sequence lcd, etc.
            bitif   bdt, mode       ;test for operation on reserve
            jsr     tstnew          ; look for a new battery
            bitif   bdt, mode
            jmp     tim04           ;skip if waiting for battery
            bitif   lb1bep, flashb  ;have we just entered low bat mode?
            jsrl    lbbeep          ;then beep 5 times
            jsrl    tststb          ;check for standby activation
            ifeq    pendng, #0      ;test for hd routine pending
            jp      tim02
            bitif   hdpnd, lcdseq   ;if flag is set then
            jsrl    iow1f7          ;test hd busy status
tim02:
            bitif   cngoff, batmsc  ;Have we switched battery banks
            jsr     resoff          ; then turn off the reserve battery
```

```
         bitif    cngben, batmsc    ;Is battery change enabled?
         jsr      docngb            ; then actually switch the battery banks
tim04:
         ld       wdcnt, #wdval     ;service watch dog 2-65K window, clock monitor on
         rbit     tpnd, icntrl      ; reset timer interrupt pending
         jmp      restor locate   01,01F            ;make sure there is no overlap ;
; The interrupt vector table starts from the lowest priority vector
; which is the VIS default address and goes down to the highest
; priority vector, the software interrupt.
;
         .=01e0
         .addrw   visvec            ;Default VIS routine must not do a RETI
         .addrw   wakeup            ;Port L Wakeup interrupt
         .addrw   reserv            ;Timer 3 this should never occur
         .addrw   reserv            ;Timer 3 this should never occur
         .addrw   time2b
         .addrw   time2a
         .addrw   reserv            ;UART this should never occur
         .addrw   reserv            ;UART this should never occur
         .addrw   reserv            ;TBD this should never occur
         .addrw   microw            ;Microwire BUSY Low
         .addrw   time1b
         .addrw   time1a
         .addrw   timer0            ;Idle timer
         .addrw   extirq            ;Host CPU IRQ (CDONE)
         .addrw   reserv            ;NMI interrupt is reserved
         .addrw   swivec            ;Software interrupt (illegal instruction)

;
; Multi input wake-up/port L interrupt vector
;
wakeup:
         ld       b, #wkpnd
         bitif    bdt, [b]          ;test for battery interrupt
         jsr      resvon            ; switch on the reserve bat
         bitif    bdt, mode         ;if reserve battery active
         jmp      restor            ; then dont check anything else
         bitif    hldreq, mode      ;are we in hold
         jp       wake00            ; then skip some tests
         bitif    vramcs, wkpnd     ;test for activity
         jsr      tstvid
wake00:
;        bitif    slpmde, mode      ;is the processor asleep?
;        jp       wake01
;        jmp      restor            ; if not then cancel tests
wake01:
         bitif    kbdint, wkpnd     ;exit on keyboard interrupt
         jsr      hldoff            ;***
         bitif    cpuint, wkpnd     ;is cpu interrupt active
         jsr      shrton            ; turn on for 50 usec
         jmp      restor
```

```
;
; Default VIS vector
;
visvec:
;       jmpl    tog
        jsrl    tog1
        jmp     start
;
; Microwire/plus busy low interrupt vector
;
microw:
        rbit    ipnd, Icntrl            ;interrupt pending
        jmp     restor ;
; Software interrupt vector
;
reserv:                                 ;***** TEMPORARY ******
swivec:
        jsrl    tog                     ;Light all the LED's
        jp      .                       ;**
        rpnd
        jmp     reset ;
; Timer T2 T2B interrupt vector
;
time2b:
        ld      b, #ophigh
        clrbit  speakr, [b]             ;turn off the speaker
        jsr     puthi
        rbit    1, t2cntrl
        jmp     restor ;
; Timer T2 T2A/underflow interrupt vector
;
time2a:
        ld      b, #ophigh
        setbit  speakr, [b]             ;turn the speaker on
        jsr     puthi
        rbit    ipnd, t2cntrl
        jmp     restor ;
; Timer T1 T1B interrupt vector
;
time1b:
        bitif   trklec, crgmde
        jp      tim1b0                  ;don't turn off trickle charge
        jsr     t1off
        jsr     t2off
tim1b0:
        rbit    intr, icntrl            ;disable interrupts until the next beep
        rbit    1, icntrl
        ld      b, #ophigh
        clrbit  speakr, [b]             ;turn off the speaker
        jsr     puthi
        jmp     restor
```

;
; Timer T1 T1A/underflow interrupt vector
;
timela:
```
        rbit    tpnd, psw       ;timer 1 interrupt pending
        jmp     restor decmin:
        bitif   charge, crgmde  ;are we charging the batteries?
        jmp     tstend          ; if so then check for end, etc.
        bitif   chrgrb, crgmde  ;are we charging the reserve battery?
        jsr     tstres          ; if so then test for -dV ld      a, sysbyt       ;to speed up checks bitif   acav, portcp    ;test for ac available
        jp      min00           ;jmp if no AC
        bitif   acovrd, a       ;test for AC override
        jmp     stmout          ; and reset timeout counters if active
min00:
        bitif   hdsec, a        ;is the hd timeout in seconds?
        jp      min01
        jsr     rldhdc          ;reset the hard disk timeout
min01:
        ld      a, sysbyt       ;to speed up checks
        bitif   lcdsec, a       ;is lcd T.O. in seconds
        jp      min02
        jsr     rldlcd
min02:
        ld      a, sysbyt       ;to speed up checks
        bitif   syssec, a       ;is system T.O. in seconds
        ret
        jmp     rldsys tstac:
        bitif   syson, portgp   ;is power good true
        jp      tstflg          ; then make sure we know it
        bitif   syson, flashb   ;power is off, but
        jmp     reset           ; if we're here the cop doesnt know it's off
        ret
tstflg:
        bitif   syson, flashb   ;does the cop know we're on
        ret                     ; yes so just return
        jmp     reset           ; restart if cop thinks we're off cmain:
        bitif   syson, portgp   ;Monitor system switch
        jmp     reset
        bitif   acav, portcp    ;Next test for AC power
        jmp     copoff          ; Stop system if no AC bitif   bdt, portlp     ;test for new battery
        jsr     waitb           ; and start over
        sbit    gie, psw        ;global interrupt enable
        nop                     ;service all interrupts now
        nop
```

```
            nop
            rbit    gie, psw ; now turn them back off
            jp      cmain waitb:
            jsr     acrgof          ;turn off A bat charger
            jsr     bcrgof          ;turn off B bat charger
            jmpl    stcrg1          ;test for new battery and restart if available
chklow:
            jsr     avrage          ;use running average for voltages
            bitif   flshmd, sysbyt  ;don't check if flash active
            ret
            bitif   lbt, debug
            jsrl    snap            ;take snapshot of system
            bitif   bankb, oplow    ;test for current bank
            jmp     tbmin           ; if bank B
            ld      a, batav ;get the A bank voltage
            ifgt    a, #vterm       ; and test for cutoff value
            jp      chk00
toolow:
            ld      b, #mode
            bitif   lobat3, [b]
            ret                     ;don't do this twice
            bitif   lobat2, [b]     ;Already in lobat 2?
            jp      toolo0          ; then just change battery banks
            jsr     setlb2          ;else force all earlier flags in case battery
                                    ; is critically low at start
toolo0:
            jsr     cngbat          ;try to change batteries
            jp      setl3           ;if bank switch failed
            ret                     ; else try again on other bank
setl3:
            jsrl    stndby          ;put system in lowest power mode
            clrbit  kbdint, wken    ; and don't allow keypress to exit
            setbit  lobat3, mode    ;wait 10 sec for new battery or AC
            ld      minute, #min1/6 ;reset the minute counter for termination
            jmpl    stbeep          ;beep and prepare to turn off chk00:
            ld      b, #bavmin
            x       a, [b]          ;store the new "minimum"
            ifgt    a, [b]          ;is it really less
            jp      tbmax           ; if so continue
            x       a, [b]          ; else restore the old value
tbmax:
            ld      a, batbv ;now read bank B's voltage
            ld      b, #bbvmax      ; and look for a maximum
            x       a, [b]          ;store the new maximum
            ifgt    a, [b]          ;is old value greater than new
            x       a, [b]          ; then put it back
tstdlt:
            .if     nimh
            ld      a, battmp
            ifgt    a, #3           ;test for NiMH battery
            setbit  nihdet, batmsc  ; and set the flag accordingly
            .endif
```

```
          ld     b, #bavmax        ;point to highest bat A voltage
          ld     a, [b+]
          sc                       ;for subtraction
          subc   a, [b]            ;calculate the delta
          bitif  lobat1, mode      ;are we already in low bat mode
          jp     tstdl2            ; then test for second delta .if    nimh
          bitif  nihdet, batmsc    ;is this a NiMH battery
          inc    a                 ; then reduce required delta to adjust for
                                   ; lower battery impedance
          .endif ifgt   a, #lb1dlt        ;is it greater than cutoff?
          jsr    lobt1a            ;set low bat 1 on A & check if B has already been set
          ld     b, #bbvmax
          ld     a, [b+]           ;to test bank B
          sc
          subc   a, [b]
          bitif  lobat1, mode      ;are we already in low bat mode
          ret .if    nimh
          bitif  nihdet, batmsc    ;is this a NiMH battery
          inc    a                 ; then reduce required delta to adjust for
                                   ; lower battery impedance
          .endif ifgt   a, #lb1dlt
          jmp    lobt1b
          ret tstdl2:   bitif  lobat2, mode      ;are we already in lobat2 mode
          ret                      ;then just return
          ifgt   a, #lb2dlt        ;is it greater than cutoff?
          jsr    lobt2a            ;low bat 2 on bank A
          ld     b, #bbvmax        ; otherwise prepare to test bank b
          ld     a, [b+]           ;to test bank B
          sc
          subc   a, [b]
          bitif  lobat2, mode      ;are we already in low bat 2 mode
          ret                      ;if so, no need to test bank b
          ifgt   a, #lb2dlt
          jmp    lobt2b            ;low bat 2 on bank b
          ret lobt1a:
          jsr    chkbat
          ifgt   a, #midptv        ;is this the initial steep slope?
          ret                      ; then just return
          setbit lb1a, debug       ;else it's low bat 1 on bank A
          bitif  lb1b, debug       ;is bank B in the same boat ?
          jp     setlb1            ;both banks have reached low bat 1
          ret
```

```
lobt1b:  jsr     chkbat
         ifgt    a, #midptv      ;is this the initial steep slope?
         ret                     ; then just return
         setbit  lb1b, debug     ;set bank B to low bat 1 bitif   lb1a, debug     ;and test bank A
         jp      setlb1          ;both banks have reached low bat 1
         ret
setlb1:  setbit  lobat1, mode
         jsrl    beep5           ;do 5 beeps
         ld      b, #oplow
         setbit  lowbat, [b]     ;turn on the low bat LED
         jmp     putlow lobt2a:  setbit  lb2a, debug     ;it's low bat 2 on bank A
         bitif   lb2b, debug     ;is bank B in the same boat ?
         jp      setlb2          ;both banks have reached low bat 2
         ld      batcnt, #2      ; switch banks in 2 seconds
         ret
lobt2b:  setbit  lb2b, debug     ;set bank B to low bat 2
         bitif   lb2a, debug     ;and test bank A
         jp      setlb2          ;both banks have reached low bat 2
         ld      batcnt, #2      ; switch banks in 2 seconds
         ret
setlb2:  ld      b, #mode
         setbit  lobat2, [b]
         setbit  lobat1, [b]     ;force flag in case battery is critically low
         jsrl    strslp
         ld      avcnst, #1      ;to start flashing
         ld      bvcnst, #1      ; and beep
;**      jsr     cngbat          ;change to the other battery
;**      ret
         ret tbmin:
         ld      a, batbv        ;get the B bank voltage
         ifgt    a, #vterm       ; and test for cutoff value
         jp      chk01
         jmp     toolow chk01:
         ld      b, #bbvmin
         x       a, [b]          ;store the new "minimum"
         ifgt    a, [b]          ;is it really less
         jp      tamax           ; if so continue
         x       a, [b]          ; else restore the old value
tamax:
         ld      a, batav        ;now read bank A's voltage
         ld      b, #bavmax      ; and look for a maximum
         x       a, [b]          ;store the new maximum
         ifgt    a, [b]          ;is old value greater than new
         x       a, [b]          ; then put it back
         jmp     tstdlt          ;test for delta V getemp:
         ld      enad, #0A7      ;setup to read temperature
         jp      getrdg          ;takes 3 clock cycles
```

```
readan:
        ld      enad, #07       ;setup to read battery A's voltage
        nop                     ;Time delay to complete conversion
        nop
        nop
getrdg:
        jsr     delay1          ;wait 10 clock periods
        nop
        nop
        nop
        nop
        nop
        nop
        ld      a, adrslt ;read A/D
        ld      enad, #0 ;Put A/D in low power mode
        ret readbn:
        ld      enad, #047      ;setup to read battery B's voltage
        jp      getrdg          ;takes 3 clock cycles ; CHKBAT determines which battery is currently selected and then reads
; the battery voltage.  The voltage is returned in A. No other registers
; are disturbed.

chkbat:
        ld      a, #07          ;set single & divide by 16
        bitif   bankb, oplow    ;if on bank B
        or      a, #040         ; setup to read battery B's voltage
        x       a, enad         ;and enable A/D converter
        jsr     delay1          ;wait 10 clock periods
        nop                     ;Time delay to complete conversion
        nop
        nop
        nop
        nop
        nop
        nop
        nop
        ld      a, adrslt ;read A/D
        ld      enad, #0 ;Put A/D in low power mode
        ret reslop:
        sbit    gie, psw ;global interrupt enable
        nop                     ;service all interrupts now
        nop
        nop
        rbit    gie, psw ; now turn them back off
        bitif   acav, portcp    ;test for AC adapter
        jp      res00           ; if operating from batteries
        jsr     tstn03          ;reenable normal operation
```

```
        jmp     main
res00:
        bitif   bdt, mode           ;wait for bdt to clear
        jp      reslop              ; until battery inserted
        ifeq    tdelay, #0
        jp      res01
        jp      reslop              ;wait before measuring batteries
res01:
        jsr     tbgood              ;next test for good battery
        jp      nogood
        jmp     main                ;start over with good battery nogood:
        jsr     setl3               ;set low bat 3 mode
        jmp     main lo3lop:
        sbit    gie, psw ;global interrupt enable
        nop                         ;service all interrupts now
        nop
        nop
        rbit    gie, psw ; now turn them back off
        bitif   acav, portcp        ;test for AC adapter
        jp      lo300               ; until AC plugged in
        jsr     tstn03              ;reenable normal operation
        jmp     main
lo300:
        bitif   bdt, mode           ;check for battery presence &
        jmp     main
        jp      lo3lop              ; wait until battery removed or AC plugged in clrlob:
        jsrl    lblof0
        ld      b, #mode            ;This is the same number of bytes and one
        bitif   lobat3, [b]         ; less clock than testing mode directly
        jsr     hldoff
        ld      b, #mode
        bitif   lobat2, [b]
        jsr     hldoff
        ld      b, #mode
        clrbit  lobat3, [b]
        clrbit  lobat2, [b]
        clrbit  lobat1, [b]
        clrbit  lb1a, debug
        clrbit  lb1b, debug
        clrbit  lb2a, debug
        clrbit  lb2b, debug
        bitif   acav, portcp        ;test for ac available
        jp      clrl00              ; continue if no AC
        ld      b, #t2cntrl
        rbit    intr, [b] ;make sure beep interrupts are disabled
        rbit    2, [b]
        ld      b, #icntrl
```

```
            sbit     0, [b]              ;enable end interrupt
            sbit     1, [b]
    clrl00:
            ld       b, #ophigh
            clrbit   speakr, [b]         ;turn off the speaker
            jmp      puthi ; TSTPOA tests to see if the case is closed and flashes led's or beeps
; accordingly.

tstpoa:
            ld       a, alrmct           ;get number of seconds switch is down
            ifgt     a, #poasec          ;more than 2 seconds
            jp       closed              ; then case must be closed
            inc      a
            x        a, alrmct           ;increment count
            ret closed:
            setbit   poa, flashb         ;set case closed flag
            bitif    acav, portcp       ;test for ac available
            jp       clos00              ; continue if no AC
            jsr      dspof0              ;turn off LCD if case closed,
            clrbit   poabep, flashb      ; but no alarm if AC present
            ret
    clos00:
            bitif    crton, flashb       ;is the crt in use
            ret                          ; then don't beep
            bitif    hldreq, mode
            jp       clos01              ;if already in standby, don't do it again
            jsrl     stndby              ;put system in standby mode and
    clos01:
            setbit   poabep, flashb      ; if on batteries then beep
            ret clrbdt:
            clrbit   bdt, wkpnd          ;make sure interrupt is clear clrbsy:
            ld       b, #oplow           ; clear io latch
            setbit   csclr, [b]          ; first write bit high
            jsr      putlow
            ld       b, #oplow
            clrbit   csclr, [b]          ; and then low again
            jmp      putlow stmout:
            ld       b, #syscnt
            ld       x, #systim
            ld       cnt, #3
    initl:
            ld       a, [x+]             ;set the initial timeouts
            x        a, [b+]
            drsz     cnt
```

```
            jp      initl
            ret dlypmd:
            ld      tdelay, #12           ;delay 12 seconds for battery to stabalize
rstpmd:
            jsr     vinit
            ld      a, batav
            ld      b, #bavmax            ;point to start of table
            x       a, [b]                ; and set max and min to current
            ld      a, [b+]               ; readings
            x       a, [b+]
            ld      a, batbv
            x       a, [b]
            ld      a, [b+]
            x       a, [b]
            ret vinit:
            jsr     readad                ;setup the running average array
            jsr     readad                ; this is slower than doing only
            jsr     readad                ; the readings we need, but we only
            jsr     readad                ; do it once in a while
            jsr     readad
            jsr     readad
            jsr     readad
            jsr     readad
            jmp     avrage reset:
            ld      psw, #0               ;turn off all potential interrupts
            ld      icntrl, #0
            ld      cntrl, #0
            setbit  chrgb, portgd         ;make sure B charger FET is off
            ld      t2cntrl, #0
            setbit  chrga, portld         ;make sure A charger FET is off
            jsr     dely50
;           jsr     dspsp                 ;** debug
            ld      sp, #06F
            jmp     start ; REFRSH will output a stream of refresh pulses every 5.12 msec when
; the COP has the cpu in hold
;

refrsh:
            ld      b, #portcd
            setbit  rfresh, [b]
            setbit  rfresh, portcc        ;enable output only during refresh
            ld      cnt, #41 ;to average 1 refresh every 125 usec.
            bitif   s386, sysbyt          ; different refresh for 286 than 386
            jp      reflop                ; do 386 refresh
ref286:
            clrbit  rfresh, [b]           ; otherwise do 286
```

```
        jsr     delay1              ;to make 13.75 usec pulse.
        nop                         ; stretch it out to 20 usec.
        nop
        nop
        nop
        nop
        setbit  rfresh, [b]
        jsr     delay1              ;to make 22.5 usec delay before next pulse
        drsz    cnt
        jp      ref286
        jp      refext              ;to turn off portc reflop:
        clrbit  rfresh, [b]
        nop                         ;to make 2.5 usec pulse
        nop                         ;one more for good measure
        setbit  rfresh, [b]
        drsz    cnt
        jp      reflop
refext:
        clrbit  rfresh, portcc      ;disable as soon as refresh is done
        clrbit  rfresh, [b]
        ret dsplon:
        clrbit  crton, flashb       ;indicate lcd active
        bitif   slpmde, mode        ; and exit sleep mode
        jmp     hldoff
dspon0:
        bitif   lcdon, oplow        ;is the LCD already on?
        ret                         ; then don't toggle pwrdwn ld      b, #lcdseq
        setbit  seqon, [b]
        setbit  onetik, [b]         ;to setup for next operation
        setbit  sync, [b]           ; synchronize with the timer tick
        ld      pendng, #4          ;set 20ms delay
        jsrl    c20off              ;assert pwrdwn* to 90c2x
        clrbit  vramcs, wken        ;disable wakeup on video activity
        clrbit  vramcs, wkpnd
        ld      b, #oplow           ;now the low byte
        setbit  vddon, [b]          ; to turn on the +5v to the LCD
;**     setbit  lcdon, [b]          ; to turn on the backlight inverter
        jp      putlow              ;do it and return to caller ; HSPEED and LSPEED are used to switch the processor speed by
; toggling the HIGHSPEED* line (OP 13) on MILES hspeed:
        ld      b, #ophigh          ; point to contents of OP high byte
        clrbit  hispd, [b]          ; low for max clock speed
        jp      puthi               ; output to OP register lspeed:
```

```
            ld      b, #ophigh              ; point to contents of OP high byte
            setbit  hispd, [b]              ; set bit high for 1/2 clock speed
            jp      puthi                   ; output to OP register dsplof:
            setbit  crton, flashb           ;indicate crt active
            bitif   slpmde, mode            ; and exit sleep mode
            jsr     hldoff
dspof0:
;**         ld      b, #lcdseq
;**         setbit  seqoff, [b]
;**         setbit  onetik, [b]             ;to setup for next operation
;**         setbit  sync, [b]               ; synchronize with the timer tick
;**         ld      pendng, #4       ;67            ;set 343ms delay
            ld      b, #oplow               ;set the OP low byte
            clrbit  lcdon, [b]              ; to turn off the backlight inverter
            clrbit  vddon, [b]              ; to turn off the +5v to the LCD
;           jp      putlow                  ; before the LCD controller ;
;           PUTLOW / PUTHI
;
; These routines write a byte pointed to by the B register to the MILES
; OP Low byte or OP High byte registers respectively
;
putlow:
            clrbit  milsad, portcd          ;C0 = 0
            jp      put
puthi:
            setbit  milsad, portcd          ;C0 = 1
put:
            ld      a, [b]
            x       a, portd                ;put the value in port D
            ld      b, #portcd              ;point to port C for faster access
            setbit  milstb, [b]             ;toggle c1 to a 1
            clrbit  milstb, [b]             ;reset to 0 to latch data
            ret ;
; HLDOFF restores the processor to full speed operation
;
hldoff:
            bitif   hldreq, mode            ;Are we in hold mode?
            jp      hld00                   ; yes then turn cpu back on
            jp      hld01                   ; no then just exit sleep
; first set IO_M~ to IO in OPH
hld00:
            ld      b, #ophigh              ;point to the op register data storage
            setbit  iom, [b]                ; D port data = 10000000 for IO
            jsr     puthi ld      b, #oplow               ;restore normal value
            clrbit  drq5, [b]
            clrbit  master, [b]
```

```
            jsr     putlow
            clrbit  hldreq, mode            ;clear the flag
hld01:
            jsrl    c20on                   ;turn on the crt controller
            bitif   poa, flashb             ;don't turn on LCD if case closed
            jp      hld02
            bitif   crton, flashb           ; or the crt is active
            jp      hld02
            jsr     dspon0                  ;turn on the display
hld02:
            jsrl    endslp                  ;exit sleep mode
            bitif   charge, crgmde   ;**    ;are we charging
            jp      hld03
            jsr     stmout                  ;reload the timeout counters
hld03:
            clrbit  pwrled, portcd          ;turn the power/standby led on
            clrbit  kbdint, wkpnd           ;clear keyboard interrupt
            clrbit  kbdint, wken            ;turn off wakeup enable **********
            clrbit  cpuint, wken
            clrbit  cpuint, wkpnd
; now set IO_M~ to M in OPH
            ld      b, #ophigh              ;point to the op register data storage
            clrbit  iom, [b]                ;point to memory
            jmp     puthi                   ; and return ;
; RESVON turns on the reserve battery if the main battery is removed
;       On Entry B points to WKPND
;
resvon:
            clrbit  nihdet, batmsc          ;clear the NiMH bit
            bitif   acav, portcp            ;test for ac available
            jp      resv01                  ;only turn on if no AC
            bitif   acav, portcp            ;test again to overcome glitches, when replacing battery
            jp      resv01                  ;only turn on if no AC
            clrbit  bdt, [b]                ;clear the interrupt
            clrbit  bdt, mode
            setbit  rbin, portcd            ; make sure the reserve is off ;**
            ret
resv01:
            ld      minute, #min4/2         ;reset the minute counter for termination
            setbit  bdt, mode               ;set flag for new bat test
            clrbit  rbin, portcd            ;turn on reserve battery
            ld      [b], #0                 ;clear all the pending interrupts
            jsrl    stndby                  ;enter standby mode and
            clrbit  kbdint, wken            ; only exit on new battery or acav
;**         setbit  cpuint, wken
;           jsr     rstpmd
            ld      b, #ophigh
            clrbit  iom, [b]                ;make sure we're set to memory cycle
            jsr     puthi
            ld      a, #L(sresdi)           ;get # of times reserve has been activated
            jsrl    m1e00
            inc     a
```

```
        x       a, portd
        except  sramw, sresdi      ;save the count
        ifeq    portd, #0          ;did we wrap
        jsr     incrdi             ;then increment upper byte
        ld      tdelay, #50        ;debounce delay 250ms
        ret
```

; TSTNEW monitors the bdt line watching for a new battery to be installed

```
tstnew:
        jsr     clrbsy             ;try to reset bat detect bit
        bitif   acav, portcp       ;did user plug in AC adapter?
        jp      tstn00             ; no then continue
        jp      tstn01             ; yes then cancel standby after delay
tstn00:
        bitif   bdt, portlp        ;check for battery presence
        jp      setdly             ; none yet
tstn01:
        clrbit  nihdet, batmsc     ;clear the NiMH bit for new battery
        drsz    tdelay             ;debounce time
        ret
tstn03:
        setbit  rbin, portcd       ;turn off reserve battery
        jsr     clrlob
        jsrl    ckrbat             ;test reserve
        clrbit  bdt, mode
        clrbit  poabep, flashb
;**     setbit  kbdint, wken       ; reenable keyboard interrupt
        ld      batcnt, #min1      ;reset battery timer and don't switch
        setbit  initdc, batmsc     ; also signal PM for initial bat switch
        jsr     dlypmd             ;initialize min and max for new bat
        jmp     hldoff             ;exit standby mode
setdly:
        ld      tdelay, #200       ; 1sec debounce
        ret
```

; TBGOOD tests the new battery to see if it is above minimum voltage
; and skips the next instruction on return if the battery is good

```
tbgood:
        bitif   acav, portcp       ;If AC plugged in then
        jp      tbg00
        retsk                      ;always return good
tbg00:
        jsr     chkbat             ;Then test new battery
;       bitif   lobat2, mode       ;** possibly eliminate        **
;       jp      tbgd2              ;** and require all new to be v+10 **
        ifgt    a, #vterm+16       ; must be above minimums
        retsk jsr     cngbat             ; if not try the other battery
        ret                        ;we can only get here if both
                                   ;banks are bad and no AC is available
```

```
            jsr     chkbat          ;read voltage on second bank
            ifgt    a, #vterm+16    ; above minimum?
            retsk                   ;start over with good battery
            ret tbgd2:
            ifgt    a, #vterm+10    ; allow at least 10 minutes operation
            retsk jsr     cngbat          ; if not try the other battery
            ret                     ;we can only get here if both
                                    ;banks are bad and no AC is available
            jsr     chkbat          ;read voltage on second bank
            ifgt    a, #vterm+10    ; allow at least 10 minutes operation
            retsk                   ;start over with good battery
            ret incrdi:
            ld      a, #L(sresdi+1) ;get # of times reserve has been charged
            jsrl    m1e00
            inc     a
            x       a, portd
            except  sramw, sresdi+1 ;save the count
            ret tstvid:
            bitif   vramcs, wken    ;is test for activity enabled?
            jp      vid00
            clrbit  vramcs, wkpnd
            ret                     ; if not active
vid00:
            bitif   hldreq, mode    ;are we in standby mode
            ret                     ; if so then return
            bitif   crton, flashb
            jp      rstlcd
            jsr     dspon0          ;else make sure display is on
            jp      rstlcd rldlcd:
            bitif   vramcs, wkpnd   ;test for activity
            jp      rstlcd          ;if active
            ifeq    lcdcnt, #0      ;no timeouts if zero count
            ret
            bitif   crton, flashb   ;is the LCD or CRT active
            ret                     ; if CRT
            drsz    lcdcnt          ; else decrement counter
            ret                     ; and return
            setbit  vramcs, wken    ;enable wakeup on video activity
            clrbit  kbdint, wkpnd
            setbit  kbdint, wken    ; or a keypress
            jmp     dspof0          ;turn off display backlight & LCD rstlcd:
```

```
            ld      a, lcdtim
            x       a, lcdcnt ;reset the lcd counter
            clrbit  vramcs, wkpnd
            jp      sysrst rldhdc:
            bitif   hdcs0, wkpnd        ;test for activity on hard disk
            jp      rsthd               ;if there is activity
            ifeq    hdcnt, #0           ;no timeouts if zero count
            ret
            drsz    hdcnt               ; else dcrement counter
            ret                         ; and return
            jmpl    drvof1              ;when we decrement to zero
rsthd:
            ld      a, hdtim ;reset the timeout from system setting
            x       a, hdcnt
            clrbit  hdcs0, wkpnd
sysrst:
            ld      a, systim           ;reset system timeout if anything active
            x       a, syscnt
            clrbit  kbdint, wkpnd
            bitif   slpmde, mode        ; and exit sleep mode if active
            jsrl    endslp              ; wakeup CPU
            jmp     clrbsy              ;to clear out I/O activity flag rldsys:
            bitif   kbdint, wkpnd       ;test keyboard
            jp      sysrst
            bitif   ioact, portgp       ;test for any active I/O devices
            jp      sysrst
            ifeq    syscnt, #0          ;no timeouts if zero count
            ret
            drsz    syscnt
            ret                         ;if nothing active
            jsrl    drvof1              ;turn off the drive
            jsr     dspof0              ;turn off the display
            setbit  vramcs, wken        ;enable wakeup on video activity
            setbit  hdcs0, wken         ; or hard disk activity
            jmpl    sleep ; READAD reads the A/D channels and maintains the last 8 values of each
; voltage and charge current in an array starting at location AVSAVE readad:
            ld      enad, #07           ;Single conversion, divide by 16
            ld      b, #enad
            ld      x, #transb          ;use the transb location to pass readings
            rc
            nop                         ;delay to wait for conversion to
            nop                         ; be complete
            nop
adloop:
            nop
            nop
```

```
            nop
            nop
            nop
            nop
            nop
            nop
            ld      a, [b]              ;get the enable command
            adc     a, #020             ;bump to the next channel
            x       a, [b+]             ; and start the next conversion
            ld      a, [b-]             ;read the previous result
            x       a, [x+]             ; and store it
            ifnc                        ;test for overflow
            jp      adloop              ; and continue till done.
            ld      enad, #0    ;Put A/D in low power mode .   bitif   charge, crgmde      ;Are we charging the batteries?
            jsrl    readv               ; then turn off charge and reread voltage
;           jsr     forcer      ;     ;Used to test parameter passing ; Update arrays with latest readings ;           ld      b, #ophigh  ;
;           clrbit  speakr, [b] ;**
;           jsr     puthi       ;**
;
;           bitif   acav, portcp        ;test for ac available
;           jsr     adjv                ; adjust if operating from batteries ld      x, #transb          ;address of A/D value array
            ld      b, #avsave          ;pointer to 1st element for A Batt
            ld      cnt, #5
update:
            ld      a, [x+]             ;get a reading
;**         ifeq    a, #0FF  ;** test
;**         setbit  adfail, batmsc   ;** test
            jsr     rotate              ; and add it to the array
            drsz    cnt
            jp      update
            ld      cnt, #3             ;now do the discharge currents
            ld      b, #battmp
uploop:
            ld      a, [x+]             ;get the A current
            x       a, [b+]             ; and save it
            drsz    cnt
            jp      uploop
            ret forcer:
            ld      b, #transb
            clr     a
            ld      cnt, #8
forlop:
            x       a, [b]
            ld      a, [b+]
```

```
            inc     a
            drsz    cnt
            jp      forlop
            ret ; AVRAGE averages the last 8 readings for each battery voltage and
; charge current and stores the 8 bit values in a table
;
avrage:
            ld      x, #avsave          ;point to the first set of 8 readings
            ld      b, #avwork          ;16 bit workspace
            jsr     avr
            x       a, batav            ;average battery A voltage
            jsr     avr
            x       a, bacrg            ;average batt A charge current
            jsr     avr
            x       a, batbv            ;average battery B voltage
            jsr     avr
            x       a, bbcrg            ;average batt B charge current
            jsr     avr
            x       a, batrv            ;average reserve battery voltage
            ret avr:
            clr     a
            x       a, [b+]             ;clear the work area
            clr     a
            x       a, [b-]
            rc
            ld      cnt, #8
avloop:
            ld      a, [x+]             ;get the next reading
            adc     a, [b]              ; and add in the accumulated value
            x       a, [b+]             ; save
            clr     a                   ;get a zero
            adc     a, [b]              ; and add in the carry and clear it
            x       a, [b-]             ; and save
            drsz    cnt
            jp      avloop ld      cnt, #3             ;setup for the shift operation
            ld      a, [b+]             ;increment b to point to avwork+1
sftlop:
            ld      a, [b]              ;it's more efficient to do it always
            rrc     a                   ; rather than a test and skip
            x       a, [b-]             ;restore the shifted value
            ld      a, [b]              ;now get the LSB
            rrc     a                   ; and shift it as well
            x       a, [b+]
            drsz    cnt
            jp      sftlop              ;three times for divide by 8 ld      a, [b-]             ;point back to avwork
```

```
            ld      a, [b]                  ;get the average value for return
            ret ; WRITAD returns the A/D values starting at 1F81h
;
;       1F81 - Bank A voltage
;       1F82 - Bank A charge current
;       1F83 - Bank B voltage
;       1F84 - Bank B charge current
;       1F85 - Reserve battery voltage
;       1F86 - Reserve battery discharge current
;       1F87 - Bank A discharge current
;       1F88 - Bank B discharge current writad:
            ld      b, #ophigh
            clrbit  iom, [b]                ;make sure we're set to memory cycle
            jsr     puthi ld      b, #transb+7            ;point to the data
            ld      x, #portd writ8p:                                     ;write the parameters to SRAM
            ld      a, [b-]                 ;get the last parameter
            x       a, [x]
            except  sramw 01F88             ; and write in reverse order
            ld      a, [b-]
            x       a, [x]
            except  sramw 01F87
            ld      a, [b-]
            x       a, [x]
            except  sramw 01F86
            ld      a, [b-]
            x       a, [x]
            except  sramw 01F85
writ4p:
            ld      a, [b-]
            x       a, [x]
            except  sramw 01F84
            ld      a, [b-]
            x       a, [x]
            except  sramw 01F83
            ld      a, [b-]
            x       a, [x]
            except  sramw 01F82
            ld      a, [b]
            x       a, [x]
            except  sramw 01F81
            ret tloff:
            ld      b, #portgd
            clrbit  txc0, cntrl             ;turn off timer
            setbit  chrgb, [b]              ; then make sure output is high
```

```
            ld      b, #tmr1lo              ;clear out the timer to avoid
            ld      [b+], #0              ; phase shifts
            ld      [b], #0
            ret t2off:
            ld      b, #portld
            clrbit  txc0, t2cntrl           ;turn off timer
            setbit  chrga, [b]            ; then make sure output is high
            ld      b, #tmr2lo              ;clear out the timer to avoid
            ld      [b+], #0              ; phase shifts
            ld      [b], #0
            ld      b, #ophigh              ;make sure the speaker is also off
            clrbit  speakr, [b]
            jmp     puthi rbcend:
            clrbit  chrgrb, crgmde
rbcoff:
            ld      b, #oplow               ;point to OP low save byte
            clrbit  chrgrb, [b]             ;turn off the Res batt charger
            jmp     putlow rbstrt:
            ld      b, #ophigh
            clrbit  iom, [b]                ;make sure we're set to memory cycle
            jsr     puthi
            ld      a, #L(srescr)           ;get # of times reserve has been charged
            jsrl    m1e00
            inc     a
            x       a, portd
            except  sramw, srescr           ;save the count
            ifeq    portd, #0               ;did we wrap
            jsr     incrcr                  ;then increment upper byte
            setbit  chrgrb, crgmde
            jsrl    clrold
            ld      brvmax, #0              ;clear peak reading
rbcon:
            bitif   trklec, crgmde          ;true if trickle charge active
            jsrl    trklof                ;  turn off trickle charge
            ld      b, #oplow
            setbit  chrgrb, [b]             ;turn on the reserve batt charger
            jmp     putlow incrcr:
            ld      a, #L(srescr+1)         ;get # of times reserve has been charged
            jsrl    m1e00
            inc     a
            x       a, portd
            except  sramw, srescr+1         ;save the count
            ret incrti:
            ld      a, #L(sresti)           ;reserve operation time
```

```
            jsrl      m1e00
            ifgt      a, #min4              ;max time
            ret
            inc       a
            x         a, portd
            except    sramw, sresti         ;save the new time
            ret wait50:
            nop                             ;40 clocks + 9 for this subroutine
            nop                             ; +14 cycles added for 80h period
            nop
            nop
            nop
            jsr       delay1
            jsr       delay1
            jsr       delay1
            jsr       delay1
            jmp       delay1
```

; ROTATE stores the last 8 values in an array pointed to by the B register
; these values are used to calculate average voltage and current for the
; battery charge function
;
;       On Entry:
;               A - contains the most recient value read by the A/D
;               B - points to the beginning of the 8 byte array
;       On Exit:
;               A - contains value being discarded
;               B - points to start of the next array

```
rotate:
            x         a, [b+]               ;Store and increment
            x         a, [b+]
            x         a, [b+]
            x         a, [b+]
            x         a, [b+]
            x         a, [b+]
            x         a, [b+]
            x         a, [b+]
            ret adjv:
            ld        x, #transb+6          ;point to discharge current
            ld        b, #transb            ;point to voltage reading
            bitif     bankb, oplow          ;what bank are we on?
            jsr       incptr
            ld        a, [x]                ;get the current
            sc                              ; prepare for subtract
            ifgt      a, #avcur             ;if current greater than normal
            jp        adjvup                ; then reduce the apparent voltage
            x         a, avwork             ;save the current
            ld        a, #(avcur+15)        ;for rounding
            subc      a, avwork
```

```
            jsr     div32
            x       a, [b]
            sc
            subc    a, [b]              ;increase the apparent delta
            jp      adjext
adjvup:
            subc    a, #(avcur-15)      ;adjust for rounding
            jsr     div32               ; and divide by 32
            add     a, [b]              ;increase the apparent voltage
adjext:
            x       a, [b]              ;store the adjusted voltage
            ret incptr:
            ld      a, [b+]             ;increment b by 2
            ld      a, [b+]
            ld      a, [x+]             ;and x by 1
            ret div32:
            ld      cnt, #5             ;shift right by 5
div32a:
            rc
            rrc     a
            drsz    cnt
            jp      div32a
            ret tstnmh:
            ifeq    tdelay, #0          ;test new battery delay
            jp      tstn0a
            jmp     adj00               ;wait for opamps to stabilize
tstn0a:
            clrbit  crgdly, mode        ;so we don't do this again
            jsr     avrage              ;compute the new averages
            ld      batcnt, #mxctim     ;max charge time = 2.75 hours for nicad
            clrbit  nihdet, batmsc      ;set NiCd to start .if     nimh
            ld      a, battmp           ;get the averaged battery temperature
            ifgt    a, #4               ;to allow for A/D offset
            jp      tstnh0
            .endif jmp     adj00a              ;if 0 we have NiCd
tstnh0:
            ld      batcnt, #mxniht     ;3.75 hours max for metal hydride
            setbit  nihdet, batmsc      ;set NiMH detected flag
            ifgt    a, #hiniht
            jp      crgoff              ;don't charge hot battery
            ifgt    a, #loniht
            jmp     adj00a              ;only charge if above minimum temp
            jp      crgoff
```

```
tsthot:
        ifgt    a, #maxnih              ;is battery too hot?
        jp      crgoff                  ;then stop charge
        jmp     adj00 crgoff:
        clrbit  chrga, crgmde           ;tell system we are done
        clrbit  chrgb, crgmde           ;tell system we are done
        jsr     t2off                   ;turn off the timer
        jsr     t1off                   ;turn off the timer
        clrbit  chrga, portlc           ; and timer A output bit
        clrbit  chrgb, portgc           ; and the B output bit
        clrbit  charge, crgmde          ; reset mode
        setbit  crgled, portcd          ;turn off the charge led.
        ret adjcrg:
        jsrl    adjnois                 ;check for noise and adjust the averages accordingly
        bitif   nimhd, portcp           ;test battery contact
        jp      adj000
        jp      crgoff                  ;don't allow NIMH bat to charge
adj000:
        ld      a, battmp               ;get the battery temperature
        bitif   crgdly, mode            ;is this the first adjust cycle
        jmp     tstnmh                  ; then check for NiMH battery
adj00a:
        .if     nimh
        bitif   nihdet, batmsc          ;is this a NiMH batery?
        jmp     tsthot                  ;then check for temp rise
        ifgt    a, #4                   ;if here we think this is a NiCd
        jmp     crgoff                  ; but it was a very cold NiMH
        .endif
adj00:
        bitif   trklec, crgmde          ;are we trickle charging?
        ret                             ; if so just return
        drsz    syscnt                  ;only adjust every 8 seconds
        ret
        bitif   act, debug
        jsrl    snap                    ;take snapshot of system
        ld      syscnt, #8
        jsr     avrage                  ;compute the new averages
        bitif   chrga, crgmde
        jsr     testa
        bitif   chrgb, crgmde
        jsr     testb
;       jsr     dspdc                   ;display duty cycle on smartview
        ret adja:
        ifgt    a, bavmin               ;try to bring current back to equal
        jp      testa0                  ; or slightly greater than it was
        ifeq    a, bavmin               ; before other bank cut off
        jp      testa0
        jp      testa1                  ;increment PWM
```

```
testa:
        ld      a, bacrg
        bitif   camax, crgmde
        jp      adja testa0:
        ifgt    a, #ihchrg              ;compare with desired charge rate
        jp      shortt                  ; if greater test for short
        bitif   nihdet, batmsc          ;is this a NiMH battery
        jp      ta0mhd
        ifgt    a, #(ilchrg-11)         ;is charge rate correct (for NiCd battery)?
        jmp     ashort                  ; yes, then test for shorted cell
        jp      testa1
ta0mhd:
        ifgt    a, #ilchrg              ;is charge rate correct?
        jmp     ashort                  ; yes, then test for shorted cell testa1:
        ld      b, #t2ralo              ;point to timer 2 a reg
        ld      a, [b]                  ; and get current setting
        ifeq    a, #(maxcrg-2)          ;are we already at maximum; don't allow 100% duty cycle
        ret                             ; then stay put
        inc     a                       ;bump the charge rate
        x       a, [b+]
        ld      a, [b+]                 ;increment to the b register
        ld      a, [b]                  ; and get the current setting
        dec     a                       ;decrement by one
        x       a, [b]                  ; and store it back
        ld      hdcnt, #3               ;force new minimum current
        setbit  apwmup, batmsc          ;last operation was increment
        ret shortt:                                 ;test for shorted battery
        ld      a, #v2cell              ;check voltage
        bitif   nihdet, batmsc          ;is this an NiMH battery?
        ld      a, #v2cnmh              ; then use a lower voltage
        ifgt    a, batav                ;is voltage nominal
        jmp     acrgof                  ;battery is shorted if less than 8.0v
        ld      b, #t2ralo              ;if not then reduce charge
        ld      a, [b]
        ifgt    a, #mincrg              ;are we above the minimum
        jp      short1
        jmp     acrgof                  ;if not then turn off ashort:
        ld      a, batav                ;get the current voltage
        bitif   nihdet, batmsc          ;is this an NiMH battery?
        jp      ahshrt                  ; then do test at lower threshold
        ifgt    a, #v2cell              ;test against minimum voltage
        ret                             ;if OK
        jmp     acrgof                  ;otherwise turn off charge ahshrt:
```

```
            ifgt    a, #v2cnmh          ;test against minimum voltage
            ret                         ;if OK
            jmp     acrgof              ;otherwise turn off charge short1:
            dec     a
            x       a, [b+]             ;decrease the on time
            ld      a, [b+]
            ld      a, [b]
            inc     a                   ; and increase the off time
            x       a, [b]
            ld      hdcnt, #2           ;wait before next check for -dV
            clrbit  apwmup, batmsc      ;last operation was decrement
            ret deca0:
            ld      b, #t2ralo          ;to then reduce charge
            ld      a, [b]
            ifgt    a, #mincrg          ;are we above the minimum
            jp      short1
            ret                         ;if not just return adjb:
            ifgt    a, bbvmin           ;try to bring current back to equal
            jp      testb0              ; or slightly greater than it was
            ifeq    a, bavmin           ; before other bank cut off
            jp      testb0
            jp      testb1              ;increment PWM testb:
            ld      a, bbcrg
            bitif   cbmax, crgmde
            jp      adjb testb0:
            ifgt    a, #ihchrg          ;compare with desired charge rate
            jmp     shortb              ; if greater test for short
            bitif   nihdet, batmsc      ;is this a NiMH battery
            jp      tb0mhd
            ifgt    a, #(ilchrg-11)     ;is charge rate correct (for NiCd battery)?
            jmp     bshort              ; yes, then test for shorted cell
            jp      testb1
tb0mhd:
            ifgt    a, #ilchrg          ;is charge rate correct?
            jmp     bshort              ; yes, then test for shorted cell testb1:
            ld      b, #t1ralo          ;point to timer 2 a reg
            ld      a, [b]              ; and get current setting
            ifeq    a, #(maxcrg-2)      ;are we already at maximum. don't allow 100% duty cycle
            ret                         ; then keep constant rate
            inc     a                   ;bump the charge rate
            x       a, [b]              ; and store it back
            ld      b, #t1rblo          ;point to the b register
```

```
            ld      a, [b]              ; and get the current setting
            dec     a                   ;decrement by one
            x       a, [b]              ; and store it back
            ld      lcdcnt, #3
            setbit  bpwmup, batmsc      ;last operation was increment
            ret shortb:                                 ;test for shorted battery
            ld      a, #v2cell          ;check voltage
            bitif   nihdet, batmsc      ;is this an NiMH battery?
            ld      a, #v2cnmh          ; then use a lower voltage
            ifgt    a, batbv            ;is voltage nominal
            jmp     bcrgof              ;battery is shorted if less than 7.5v
            ld      b, #t1ralo          ;if not then reduce charge
            ld      a, [b]
            ifgt    a, #mincrg          ;are we above the minimum
            jp      short2
            jmp     bcrgof              ;if not then turn off bshort:
            ld      a, batbv            ;get the current voltage
            bitif   nihdet, batmsc      ;is this an NiMH battery?
            jp      bhshrt              ; then do test at lower threshold
            ifgt    a, #v2cell          ;test against minimum voltage
            ret                         ;if OK
            jmp     bcrgof              ;otherwise turn off charge bhshrt:
            ifgt    a, #v2cnmh          ;test against minimum voltage
            ret                         ;if OK
            jmp     acrgof              ;otherwise turn off charge short2:
            dec     a
            x       a, [b]              ;decrease the on time
            ld      b, #t1rblo
            ld      a, [b]
            inc     a                   ; and increase the off time
            x       a, [b]
            ld      lcdcnt, #2
            clrbit  bpwmup, batmsc      ;last operation was decrement
            ret decb0:
            ld      b, #t1ralo          ;to then reduce charge
            ld      a, [b]
            ifgt    a, #mincrg          ;are we above the minimum
            jp      short2
            ret                         ;if not just return tstend:
            bitif   cet, debug
            jsrl    snap                ;take snapshot of system
            drsz    batcnt              ;Maximum charge time
```

```
          jp      tst00
          jsr     tst01              ;continue to monitor reserve battery
          jmpl    trickl             ;trickle charge
tst00:
          bitif   chrga, crgmde
          jsr     testav
          bitif   chrgb, crgmde
          jsr     testbv
tst01:
          bitif   chrgrb, crgmde
          jmp     testrv
          ret setvma:
          ifgt    a, [b]
          ld      avcnst, #cvtimr
          ifgt    a, [b]
          x       a, [b]             ;store most recent voltage as new max
          jp      vacnst tstav0:
          x       a, [b]             ;store new maximum
          ld      avcnst, #cvtimr    ;voltage changed so reset timer
          jmp     testac    ;**     ;test if current is increasing also
;**       ret testav:
          ld      a, batav           ;get new average
          ld      b, #bavmax
          bitif   apwmup, batmsc    ;did we adjust up or down
          jp      tstav1             ; if adj up
          drsz    hdcnt              ;no -dV after -dPulse width
          jp      setvma
          ld      hdcnt, #1
tstav1:
          ifgt    a, [b]
          jp      tstav0             ;set new maximum value
          ifeq    a, [b]             ;are we at a plateu
          jp      vacnst             ; test for timeout
          rc
          adc     a, #deltav         ;add in the delta for comparison
          ifgt    a, [b]             ;look for -dV
          jp      vacnst
          jp      acrgof             ; then turn off vacnst:
          drsz    avcnst             ;decrement counter
          jmp     testac acrgof:
          clrbit  chrga, crgmde      ;tell system we are done
          jsr     t2off              ;turn off the timer
          clrbit  chrga, portlc     ; and timer output bit
          bitif   chrgb, crgmde      ;is bank B still charging
```

```
          jp      stepb2              ;adjust the bank B pwm
          jmpl    trickl stepb:
          ifeq    lcdcnt, #1
          jp      stepb1              ;if 1 then we have not changed pwm recently
          jp      stepb2              ; otherwise we just bumped it
stepb1:
          ld      a, bbvmax           ;get the peak voltage on B
          ld      b, #batbv           ;and the present reading
          ifgt    a, [b]              ;has voltage dropped?
          jmp     bcrgof              ; then turn off B as well
          ld      a, bbcrg            ; else check current
          ld      b, #bbimin          ; for an increase
          ifgt    a, [b]              ; of even 1 unit
          jmp     bcrgof              ; and turn off
stepb2:
          setbit  cbmax, crgmde
          ld      a, bbcrg            ;get the present current value
          x       a, bbvmin           ;and save it so we can adjust pwm
          jsr     decb0
          jsr     decb0
          jsr     decb0
          jsr     decb0
          jsr     decb0
          ld      a, #ilchrg-75       ;if voltage still ramping up then
          ifgt    a, bbcrg            ;only step back half way
          ret
          jsr     decb0
          jsr     decb0
          jsr     decb0
          jsr     decb0
          jmp     decb0 testac:
          ld      a, bacrg            ;check the current reading
          ld      b, #baimin          ; and compare with old average
          bitif   apwmup, batmsc      ;did we adjust up
          jp      tstacr              ;then test for delay
          jp      tstaca
tstacr:
          drsz    hdcnt
          jmp     setima              ;set new minimum
          ld      hdcnt, #1
tstaca:
          ifgt    a, [b]              ;is I increasing
          jp      tstac1              ; then test limits
tstac0:
          x       a, [b]              ;save new minimum if I not increasing
          ret tstac1:
          sc                          ;clear borrow for subtraction
          subc    a, [b]              ;find the delta I
```

```
            ifgt    a, #deltai              ; cutoff if +dI > 8ma.
            jp      tstac2
            ret
tstac2:     ld      a, batav
            .if     nimh
            bitif   nihdet, batmsc          ;is this a NiMH battery
            jp      tacmhd
            .endif
            ifgt    a, #(fulcrg+10)         ;make sure that it's not a false end of charge
            jmp     acrgof                  ;the extra 10 is for NiCd
            ret                             ;false alarm
tacmhd:                                     ;NiMhd full charge test
            .if     nimh
            ifgt    a, #fulcrg              ;make sure that it's not a false end of charge
            jp      tacmht                  ;check delta Temp.
            ret
tacmht:     jsrl    getemp                  ;returns the temperature in A
            ifgt    a, initemp              ;did we reach delta T
            jmp     acrgof
            ret                             ;false alarm
            .endif setima:
            x       a, [b]                  ; and set new minimum
            clrbit  camax, crgmde
            ret setvmb:
            ifgt    a, [b]
            ld      bvcnst, #cvtimr
            ifgt    a, [b]
            x       a, [b]                  ; store as new max
            jp      vbcnst tstbv0:
            x       a, [b]                  ;store potential new maximum
            ld      bvcnst, #cvtimr         ;voltage changed so reset timer
            jmp     testbc          ;**     ;test if current is increasing also
;**         ret testbv:
            ld      a, batbv                ;get new average
            ld      b, #bbvmax
            bitif   bpwmup, batmsc
            jp      tstbv1
            drsz    lcdcnt
            jp      setvmb
            ld      lcdcnt, #1
tstbv1:
            ifgt    a, [b]
            jp      tstbv0
            ifeq    a, [b]                  ;are we at a plateu
            jp      vbcnst                  ; test for timeout
            rc
```

```
          adc     a, #deltav
          ifgt    a, [b]              ;look for -dV
          jp      vbcnst
          jp      bcrgof              ; then turn off vbcnst:
          drsz    bvcnst              ;decrement counter
          jmp     testbc bcrgof:
          clrbit  chrgb, crgmde       ;tell system we are done
          jsr     tloff               ;turn off the timer
          clrbit  chrgb, portgc       ; and the output bit
          bitif   chrga, crgmde       ;is bank A still charging
          jp      stepa2              ;adjust the bank A pwm
          jmpl    trickl stepa:
          ifeq    hdcnt, #1
          jp      stepa1              ;if 1 then we have not changed pwm recently
          jp      stepa2              ; otherwise we just bumped it
stepa1:
          ld      a, bavmax           ;get the peak voltage on A
          ld      b, #batav           ;and the present reading
          ifgt    a, [b]              ;has voltage dropped?
          jmp     acrgof              ; then turn off A as well
          ld      a, bacrg            ; else check current
          ld      b, #baimin          ; for an increase
          ifgt    a, [b]              ; of even 1 unit
          jmp     acrgof              ; and turn off
stepa2:
          setbit  camax, crgmde
          ld      a, bacrg            ;get the present current value
          x       a, bavmin           ;and save it so we can adjust pwm
          jsr     deca0
          jsr     deca0
          jsr     deca0
          jsr     deca0
          jsr     deca0
          ld      a, #ilchrg-75       ;if still ramping up current
          ifgt    a, bacrg
          ret
          jsr     deca0
          jsr     deca0
          jsr     deca0
          jsr     deca0
          jmp     deca0 testbc:
          ld      a, bbcrg            ;check the current reading
          ld      b, #bbimin          ; and compare with old average
          bitif   bpwmup, batmsc
          jp      tstbcr
          jp      tstbca
```

```
tstbcr:
        drsz    lcdcnt
        jmp     setimb
        ld      lcdcnt, #1
tstbca:
        ifgt    a, [b]                  ;is I increasing
        jp      tstbc1
tstbc0:
        x       a, [b]
        ret tstbc1:
        sc
        subc    a, [b]
        ifgt    a, #deltai
        jp      tstbc2
        ret
tstbc2: ld      a, batbv
        .if     nimh
        bitif   nihdet, batmsc          ;is this a NiMH battery
        jp      tbcmhd
        .endif
        ifgt    a, #(fulcrg+10)         ;make sure that it's not a false end of charge
        jmp     bcrgof                  ;the extra 10 is for NiCd
        ret                             ;false alarm
tbcmhd:                                 ;NiMhd full charge test
        .if     nimh
        ifgt    a, #fulcrg              ;make sure that it's not a false end of charge
        jp      tbcmht                  ;check delta Temp.
        ret
tbcmht: jsrl    getemp                  ;returns the temperature in A
        ifgt    a, initemp              ;did we reach delta T
        jmp     bcrgof                  ; then turn off charge
        ret
        .endif setimb:
        x       a, [b]                  ; and use as new minimum
        clrbit  cbmax, crgmde
        ret tstres:
        jsr     avrage                  ;compute average voltage testrv:
;       jsr     dsprv                   ;**     Display V on smartview
        ld      a, batrv                ;get most recent reading
        ifeq    a, #0FF                 ;Maximum possible voltage?
        jmp     rbcend                  ; indicates error so turn off charger
        ld      b, #brvmax              ;point to stored maximum
        x       a, [b]                  ; save new maximum?
        ifgt    a, [b]                  ;has V decreased
        jp      rbcext                  ; then turn off charge
        ret                             ; otherwise just return
```

```
rbcext:
        ld      b, #ophigh
        clrbit  iom, [b]            ;make sure we're set to memory cycle
        jsr     puthi
        ld      portd, #0
        except  sramw, sresti       ;reset reserve usage time
        jmp     rbcend dspcg:
        ld      a, portcd           ;port c data
        jsr     makhex
        jsr     smrtlo              ;output to lower 2 bytes
        ld      a, portgp           ; and port g data
        jsr     makhex
        jmp     smrthi              ;upper 2 bytes dspsp:
        ld      a, sp               ;stack pointer
        jsr     makhex
        jsr     smrtlo              ;output to lower 2 bytes
        ld      b, #avwork
        ld      [b+], #070          ;'p'
        ld      [b], #073           ;'s'
        jmp     smrthi              ;upper 2 bytes dsprv:
        ld      a, batrv
        jsr     makhex
        jsr     smrtlo              ;output to lower 2 bytes
        ld      a, brvmax
        jsr     makhex
        jmp     smrthi              ;upper 2 bytes dspdc:
        ld      a, t1ralo           ;on time for bank b
        jsr     makhex
        jsr     smrtlo              ;output to lower 2 bytes
        ld      a, t2ralo           ;on time for bank a
        jsr     makhex
        jmp     smrthi              ;upper 2 bytes makhex:
        ld      b, #avwork          ;point to temp area
        push    a
        jsr     hexnbl              ;convert to hex
        pop     a                   ;recover original value
        swap    a                   ; and reverse nibbles hexnbl:
        and     a, #0F              ;mask off upper nibble
        add     a, #030
        ifgt    a, #039
```

```
        add     a, #07
        x       a, [b+]
        ret
```

;This is a debug routine to write values to smart view on the host processor bus ; The X register is used to point to the Data to be output
; The B register points to Port D during the data transfer

```
smrtlo:
; first set IO_M~ to IO in OPH
        ld      b, #ophigh              ;point to the op register data storage
        setbit  iom, [b]                ; D port data = 10000000 for IO
        jsr     puthi ld      x, #avwork              ;pointer for data to be output ; next, set up DRQ5 in OPL
        ld      a, oplow                ;get the op register data
        x       a, portd                ; so we can retreive this later
        ld      a, portd                ; emulate a store instruction
        or      a, #drq5                ;set the drq5 bit in the register save data
        x       a, portd                ; D port data = 00000001 for DRQ5
        ld      b, #portcd
        clrbit  milsad, [b]             ; C0 = 0
        setbit  milstb, [b]             ; C1 = 1 (this starts the DREQ cycle)

; now look for DACK ckdack

; next, pull master high in OPL
        ld      b, #portd               ; point to the D port
        setbit  master, [b]             ; D port data = 00000011 for master*
        clrbit  milstb, portcd          ; close the OP Low register ; write desired data to D port
        x       a, [x+]                 ;recover the data to output
        x       a, [b]                  ; and store it in port D ; execute the io write exception cycle to port 94h
        except  iow, 094 x       a, [x]                  ;get the next byte to output
        x       a, [b]                  ; and put it in port D ; execute the io write exception cycle to port 95h
        except  iow, 095

; clear DRQ and master*
        ld      a, oplow
        x       a, [b]                  ; A contains the original OP Low value
        ld      b, #portcd              ; point back to port C
        setbit  milstb, [b]             ; turn off master mode
```

```
        clrbit    milstb, [b]

; now set IO_M~ to M in OPH
        ld        b, #ophigh              ;point to the op register data storage
        clrbit    iom, [b]                ;point to memory
        jmp       puthi                   ; and return
```

;This is a debug routine to write values to smart view on the host processor bus ; The X register is used to point to the Data to be output
; The B register points to Port D during the data transfer smrthi:
; first set IO_M~ to IO in OPH
```
        ld        b, #ophigh              ;point to the op register data storage
        setbit    iom, [b]                ; D port data = 10000000 for IO
        jsr       puthi ld        x, #avwork              ;pointer for data to be output
```

; next, set up DRQ5 in OPL
```
        ld        a, oplow                ;get the op register data
        x         a, portd                ; so we can retreive this later
        ld        a, portd                ; emulate a store instruction
        or        a, #drq5                ;set the drq5 bit in the register save data
        x         a, portd                ; D port data = 00000001 for DRQ5
        ld        b, #portcd
        clrbit    milsad, [b]             ; C0 = 0
        setbit    milstb, [b]             ; C1 = 1 (this starts the DREQ cycle)
```

; now look for DACK

```
        ckdack
```

; next, pull master high in OPL
```
        ld        b, #portd               ; point to the D port
        setbit    master, [b]             ; D port data = 00000011 for master*
        clrbit    milstb, portcd          ; close the OP Low register
```

; write desired data to D port
```
        x         a, [x+]                 ;recover the data to output
        x         a, [b]                  ; and store it in port D
```

; execute the io write exception cycle to port 96h
```
        except    iow, 096 x         a, [x]                  ;get the next byte to output
        x         a, [b]                  ; and put it in port D
```

; execute the io write exception cycle to port 97h
```
        except    iow, 097
```

; clear DRQ and master*
```
        ld        a, oplow
```

```
        x       a, [b]              ; A contains the original OP Low value
        ld      b, #portcd          ; point back to port C
        setbit  milstb, [b]         ; turn off master mode
        clrbit  milstb, [b]

; now set IO_M~ to M in OPH
        ld      b, #ophigh          ;point to the op register data storage
        clrbit  iom, [b]            ;point to memory
        jmp     puthi               ; and return ; SHRTON will drop master for a short period of time to allow the cpu to
; service the timer interrupt in order to maintain the DOS/UNIX clock shrton:
        clrbit  cpuint, wkpnd       ;clear the interrupt bit
        bitif   drq5, oplow         ;are we in hold currently
        jp      shrt00              ; if so then turn on for a short time
        ret                         ; otherwise just return
shrt00:

; set IO_M~ to IO in OPH ld      b, #ophigh          ;point to the op register data storage
        setbit  iom, [b]            ; D port data = 10000000 for IO
    ;   setbit  pd9020, [b]         ;turn on 90C20
        jsr     puthi ld      b, #oplow
        clrbit  drq5, [b]           ;drop DRQ5
        clrbit  master, [b]         ; and master
        jsr     putlow              ;for a short time
        ld      b, #portlp          ;point to the L port
onloop:
        bitif   cpuint, [b]         ;wait for the interrupt to be serviced
        jp      onloop              ; by the host cpu jsr     delay               ; give cpu time to complete interrupt
        ld      b, #oplow
        setbit  drq5, [b]           ;now lets reassert drq, etc
        ld      a, [b]              ;get the op register data
        x       a, portd            ;and write to port d
        setbit  master, [b]         ; set flag while we still point there
        ld      b, #portcd
        clrbit  milsad, [b]         ; C0 = 0
        setbit  milstb, [b]         ; C1 = 1 (this starts the DREQ cycle)

; now look for DACK ckdack

; next, pull master high in OPL
```

```
          ld      b, #portd              ; point to the D port
          setbit  master, [b]            ; D port data = 00000011 for master*
          clrbit  milstb, portcd         ; close the OP Low register
; now set IO_M~ to M in OPH
          ld      b, #ophigh             ;point to the op register data storage
          clrbit  iom, [b]               ;point to memory
;         bitif   crton, flashb          ;are we using the crt
;         jp      shrt01                 ; then don't turn video off
;         clrbit  pd9020, [b]            ;turn off 90C20
;shrt01:
          jmp     puthi                  ; and return ; SPMOFF outputs a active high pulse to kill the system power module.
; This routine does not return, it just loops waiting for power to go away spmoff:
          jsrl    stndby                 ;put system in lowest power mode
          jsrl    kildsp                 ;force the display off without sequencing
          ld      psw, #0                ;Stop all interrupts
          ld      b, #oplow
          ld      a, [b]                 ;get the current settings
          and     a, #bankb+drq5+master  ;mask off led and reserve charger
          x       a, [b]                 ;and write it out
          jsr     putlow
          ld      b, #ophigh
          clrbit  dcoff, [b]             ;Start low
          jsr     puthi ; COPOFF turns off the COP by forcing a watchdog error copoff:
          ld      b, #ophigh
          ld      [b], #0                ;clear all bits
          setbit  fetoff, [b]            ;make sure FET is off
          setbit  dcoff, [b]             ;make sure power off bit is high
          jsr     puthi                  ;This is to get around powerup
                                         ; problem with MILES
          ld      b, #oplow
          ld      a, [b]                 ;get the current settings
          and     a, #bankb+drq5+master  ;mask off led and reserve charger
          x       a, [b]                 ;and write it out
          jsr     putlow
          setbit  rbin, portcd           ;turn off the reserve battery
          ld      portcc, #0             ;tri-state all outputs
          ld      portcd, #0
          ld      portlc, #0
          ld      portld, #0
          ld      portgc, #0
          ld      portgd, #0
;         ld      cnt, #50  ;minimum of 250msec delay
;         rbit    5, icntrl ;clear the T0 overflow bit
;         jsr     dely5a                 ;wait for power to go away
          ld      wdcnt, #0              ;invalid data for watchdog to force reset
```

```
            jp       .                      ;wait for power to go away
;tstflh:                                    ;** DEBUG **
;           ld       b, #oplow
;           jsr      fllbat
;           jsr      dely50
;           jp       tstflh
;fllbat:
;           bitif    lowbat, [b]
;           jmp      lbloff
;           jmp      lblon ;
; Routine to switch batteries every 4 minutes and
; then reset idle count down timer. Skips next instruction
; after returning if operation is successful
;
cngbat:
            ld       a, batcnt   ;how long did we use the previous bank
            ifgt     a, #min1*3  ; less than 1 minute?
            ret                  ;   then do error return
            ld       batcnt, #min4 ;**
            jsrl     tstbat      ;make sure other bank is good
            ret
cngalt:
            bitif    initdc, batmsc  ;is this the first bank switch
            ld       batcnt, #min4/2 ; first use is 2 minutes for second bank
            clrbit   initdc, batmsc  ; then clear the flag to return to 4 min.
            setbit   cngben, batmsc  ;enable change on next timer tick
            setbit   blinkc, flashb  ;enable reserve for one more timer tick
            bitif    chrgrb, crgmde  ;Is reserve battery being charged?
            jsrl     rbcoff          ;turn it off before enabling Rbat
            clrbit   rbin, portcd    ;turn on reserve battery
            clrbit   bdt, wken       ;disable battery detect interrupt
            ld       tdelay, #5      ;1 sec delay before battery test
            retsk                    ;pretend we're done docngb:
            bitif    blinkc, flashb
            jp       dlycng
            setbit   blinkc, flashb  ;enable reserve for one more timer tick
            setbit   cngoff, batmsc  ;enable reserve off on next timer tick
            clrbit   cngben, batmsc  ; and don't switch again for a while
cngbnk:
            ld       b, #oplow       ;point to the op register data storage
            ld       a, #bankb       ;set bit to invert
            xor      a, [b]          ;invert it
            x        a, [b]          ;and store the new value
            jmp      putlow          ;set the byte in the MILES OP register dlycng:
            clrbit   blinkc, flashb  ;extra 5.12 msec.
            ret reseta:
```

```
        ld      a, batav
        x       a, bavmax       ;reset maximum on A
        ret resoff:
        bitif   blinkc, flashb
        jp      dlycng
resof0:
        clrbit  cngoff, batmsc  ;so we won't come here again
        jsr     clrbdt          ;reset the battery detect latch
        bitif   bdt, portlp     ;then check to see if battery really present
        jp      nobat           ;if battery just removed
        setbit  rbin, portcd    ;if good then turn off the reserve
        bitif   chrgrb, crgmde  ;was the reserve battery charging before bank switching
        jsrl    rbcon
        setbit  bdt, wken       ; and reenable the bdt interrupt
        bitif   bankb, oplow    ;check for current bank
        jp      reseta
        ld      a, batbv
        x       a, bbvmax       ;reset maximum on B
        ret nobat:
        clrbit  nihdet, batmsc  ;clear the NiMH bit for new battery
        setbit  bdt, wkpnd      ;make sure interrupt is active
        setbit  bdt, wken       ; and reenable the bdt interrupt
        ret                     ; then continue delay:
        ld      cnt, #180       ;approx 3.6 msec delay
dellop:
        jsr     delay1          ; 20usec/loop at 8MHz
        drsz    cnt
        jp      dellop
        ret delay1:
        ret dely50:
        ld      cnt, #20 ;**10  ;minimum of 51msec delay
        rbit    tpnd, icntrl    ;clear the T0 overflow bit
dely5a:
        ifbit   tpnd, icntrl    ;require 1 full idle period to start
        jp      dely51          ; before servicing watchdog
        jp      dely5a          ;loop
dely51:
        rbit    tpnd, icntrl    ;clear the T0 overflow bit
dely52:
        ifbit   tpnd, icntrl    ;wait for it to be set again
        jp      dely53
        jp      dely52          ;loop
dely53:
```

```
        ld     wdcnt, #wdval    ;service watch dog 2-65K window, clock monitor on
        drsz   cnt              ;10 timer overflows
        jp     dely51           ;wait another 5.12msec
        ret locate 0B,-1            ;make sure there is no overlap .=0C00                  ; SRAM address for ports 02 - FFh ; This routine will allow the COP to read I/O ports between it's ending
; address and 0FFh. The routine is called with A = L(port address)

ior000:
        laid                    ;read data out of SRAM
        ret

.=0D00                  ; SRAM address for ports 102 - 1FFh

; This routine will allow the COP to read I/O ports between it's ending
; address and 01FFh. The routine is called with A = L(port address)

ior100:
        laid                    ;read data out of SRAM
        ret

.=0E00                  ; SRAM address for ports 202 - 2FFh

; This routine will allow the COP to read I/O ports between it's ending
; address and 02FFh. The routine is called with A = L(port address)

ior200:
        laid                    ;read data out of SRAM
        ret

.=0F00                  ; SRAM address for ports 302 - 3FFh

; This routine will allow the COP to read I/O ports between it's ending
; address and 03FFh. The routine is called with A = L(port address)

ior300:
        laid                    ;read data out of SRAM
        ret

.=01000

;
; External interrupt G0 interrupt vector
;
extirq:
        clrbit  pwrled, portcd  ;turn on power LED
        jsr     getcmd          ;read the command from SRAM
        jsr     dispch          ;decode and execute
```

```
        bitif   dlycdn, lcdseq      ;not yet finished with command
        jp      waitex              ; then exit without cdone
        ld      b, #ophigh
        clrbit  iom, [b]    ;make sure we're set to memory for CDONE
        jsrl    puthi
        rbit    ipnd, psw           ;reset external interrupt pending flag
        except  scdone, 0           ; set CDONE for the host
        jmpl    restor dispch:
        add     a, #L(tblbeg)
        ifgt    a, #L(tblend)
        jp      cmderr              ;invalid command
        jid waitex:
        rbit    1, psw              ; disable external interrupt
        jmpl    restor              ;to return to normal processing cmderr:
        ld      b, #ophigh
        clrbit  iom, [b]            ;make sure we're set to memory cycle
        jsrl    puthi ld      portd, #0ff         ;indicate command error
        except  sramw, 01f80        ;replace original command
        ret tblbeg:
        .addr   cksum               ; 0 - Checksum SRAM
        .addr   slftst              ; 1 - Initiate self test
        .addr   togbat              ; 2 - Switch batteries
        .addr   sbatA               ; 3 - Select battery A
        .addr   sbatB               ; 4 - Select battery B
        .addr   sbatR               ; 5 - Select reserve battery
        .addr   dsbatR              ; 6 - Deselect reserve battery
        .addr   dspon               ; 7 - Turn on backlight and display
        .addr   dspoff              ; 8 - Turn off backlight and display
        .addr   batst               ; 9 - Return battery status
        .addr   sleep               ; A - Enter sleep mode
        .addr   endslp              ; B - Exit sleep mode
        .addr   slwclk              ; C - Enter slow clock mode
        .addr   fstclk              ; D - Enter fast clock mode
        .addr   stndby              ; E - Enter standby mode
        .addr   pwrdwn              ; F - Turn off System Power Module
        .addr   acpchk              ;10 - Current AC power & switches check
        .addr   strtpm              ;11 - Start power management
        .addr   drvoff              ;12 - Put hard disk to sleep
        .addr   endpm               ;13 - Stop power management functions
        .addr   c20on               ;14 - Turn on the WD 90C20
        .addr   c20off              ;15 - Turn off the WD 90C20
        .addr   sysimg              ;16 - Image of cop Ram  0=immediate,
                                    ;                       1=crg end test
                                    ;                       2=adj crg
```

```
                                      ;             4=low bat test
        .addr    stchrg               ;17 - Start a charge cycle for test
        .addr    outlow               ;18 - Set state of OP Low bits
        .addr    outhi                ;19 - Set state of OP High bits
        .addr    spwmt1               ;1A - Set high/low timer 1
        .addr    spwmt2               ;1B - Set high/low timer 2
        .addr    crgres               ;1C - Charge reserve 0 = off/1 = on
        .addr    notrkc               ;1D - Do not allow trickle 0 = trkl off
tblend:
        .addr    flash                ;1E - 0 = turn off BDT and Standby, FET on for flash ; The following is the actual table of jumps to the various routines.
; This is a rather convoluted way of doing things, but this is the
; simplest indirect jump/dispatch method supported by the COP.
; This entire table starting from the JID instruction above must
; fit in the same 100H page of memory.

cksum:
        jmp      chksum slftst:
        ret
;       jmp      cmderr               ;invalid command sbatA:
        setbit   bankb, oplow         ;make system think it's on bank B
togbat:
        jsrl     cngalt               ;force the change always
        jmp      cmderr
        ld       batcnt, #min4        ; and reset the timeout
        ret sbatB:
        clrbit   bankb, oplow         ;make system think it's on bank A
        jp       togbat sbatR:
        clrbit   rbin, portcd         ;turn on reserve battery
        ret dsbatR:
        setbit   rbin, portcd         ;turn off reserve battery
        ret dspon:
        bitif    lcdon, oplow         ;is the LCD already on?
        ret                           ; then don't toggle pwrdwn
        setbit   dlycdn, lcdseq       ;force delay for operation
        jmpl     dsplon               ;turn on display and backlight dspoff:
;**     setbit   dlycdn, lcdseq       ;force delay for operation
        jmpl     dsplof               ;turn off the display & backlight
```

```
batst:
        jsrl    readad              ;read the A/D channels
;       jsrl    avrage              ;compute the average
        jmpl    writad              ;and return the instantaneous results sleep:
        setbit  slpmde, mode
        ld      a, #094  ;**0C4                     ;250KHz for 286
        bitif   s386, sysbyt        ;is it really a 386
        xor     a, #0    ;**50                      ; if so switch to 2 MHz
        x       a, temp             ;set sleep mode register
        jsr     htctlw              ;write HT21 control and return
        clrbit  kbdint, wkpnd       ;Clear keyboard to start
        setbit  kbdint, wken        ;enable wakeup interrupt
        ret endslp:
        clrbit  slpmde, mode
        ld      temp, #014          ;turn off sleep mode
        jmp     htctlw              ;write HT21 control and return slwclk:
        jmpl    lspeed              ;set the processor speed to low fstclk:
        jmpl    hspeed              ;set the processor speed to high pwrdwn:
        jmpl    spmoff              ;turn off System Power Module acpchk:
        jmp     chkac strtpm:
        ld      cnt, #4             ;4 parameters currently
        jsr     gsparm              ; get the parameters
        jsr     xsump               ;checksum the parameters
        x       a, [x]              ; and store the checksum
        jmpl    stmout              ; then set the timeout values endpm:
        jmp     cmderr              ;invalid command
chksum:
        jmp     chk1st              ;checksum 1st block of program stndby:
;**     jsr     chkact              ;see if system currently busy
        jsr     drvoff              ;turn off the drive
        jsrl    dspof0              ;turn off the display
;       bitif   crton, flashb       ;are we using the crt
;       jp      stnd00
        jsr     c20off              ;turn off the 90C20
```

```
stnd00:
        jsr     sleep                   ;slow the clock
        jsr     cpuhld                  ;lowest power mode
        ld      erc, #1                 ;setup to flash every two seconds
        ret sysimg:
        jmp     sysim0                  ;setup for ram snapshot stchrg:
        jmp     stcrg1 crgres:
        jsr     get1p
        ifeq    transb, #0
        jmpl    rbcend
        jmpl    rbstrt notrkc:
        jsr     get1p
        ifeq    transb, #0
        jmp     strflg                  ;turn off trickle charge
        clrbit  notrkl, mode
        ret flash:
        jmp     flash0 outlow:
        jsr     get1p                   ; get 1 parameter from data area
        ld      a, transb               ; and store it in transb
        ld      b, #oplow
        x       a, [b]
        jmpl    putlow                  ; then output to OP Low and return outhi:
        jsr     get1p
        ld      a, transb
        ld      b, #ophigh
        x       a, [b]
        jmpl    puthi                   ; same as above to OP High spwmt1:
        jp      spwm1x spwmt2:
        jmp     spwm2x drvoff:
        jmp     drvof1 c20off:
        ld      b, #ophigh              ;point to op high byte
        clrbit  pd9020, [b]             ;turn off the 90C20
```

```
            jmpl    puthi               ; after the backlight and return c20on:
            ld      b, #ophigh          ;point to op high byte
            setbit  pd9020, [b]         ;turn on 90C20
            jmpl    puthi               ; before the backlight spwm1x:
            jsr     get4p
spwm1a:
            clrbit  txc0, cntrl         ;turn off the timer
            setbit  chrgb, portgd       ; and force the charger off
            setbit  chrgb, portgc       ; G3 is an output
            ld      x, #transb
            ld      b, #t1ralo
            ld      a, [x+]             ;transfer the first 2 parameters
            x       a, [b+]
            ld      a, [x+]
            x       a, [b]
            ld      b, #t1rblo          ;then do the next two
            ld      a, [x+]
            x       a, [b+]
            ld      a, [x]
            x       a, [b]
            ld      cntrl, #0B0         ; turn on timer
            setbit  chrgb, crgmde
            ret spwm2x:
            jsr     get4p               ;transfer indirect to allow alt entry
spwm2a:
            clrbit  txc0, t2cntrl       ;Make sure we're off to start
            setbit  chrga, portld       ; including the FET control line
            setbit  chrga, portlc       ; make L4 an output
            ld      x, #transb
            ld      b, #t2ralo
            ld      cnt, #4             ;transfer 4 parameters
t2loop:
            ld      a, [x+]
            x       a, [b+]
            drsz    cnt
            jp      t2loop ld      t2cntrl, #0B0       ;enable pwm mode
            setbit  chrga, crgmde
            ret stcrg1:
            bitif   acav, portcp        ;don't try to charge from batteries
            ret
            jsrl    clrbsy              ;clear battery detect
            bitif   bdt, portlp         ;is there a battery present
            ret                         ; nop if no battery present
            bitif   bankb, oplow        ;default to bank A, which will ensure
```

```
            jsr     cngbnk              ;that A path has the relay cap. & We may add a cap. in B
path
            jsr     ckrbat              ;charge Rbat while fast charging, if needed
            bitif   nimhd, portcp       ;test battery contact. This signal is high on new bottom boards
            jp      stcrg2
            ret                         ;don't allow NIMH bat to charge in a 320N system
stcrg2:
            ld      second, #seccnt     ;reset the seconds counter
            ld      minute, #min1       ; and the minute counter also
            ld      tdelay, #12         ;wait 12 sec to test temperature
            setbit  crgdly, mode        ; then enable NiMH test
            clrbit  blinkc, flashb
            clrbit  crgled, portcd      ;indicate start of charge cycle
            ld      syscnt, #8
            ld      lcdcnt, #1
            ld      hdcnt, #1
            jsr     clrold              ;clear the peak readings
            ld      baimin, #0FF
            ld      bbimin, #0FF
            ld      bavmax, #0
            ld      bbvmax, #0
            ld      avcnst, #cvtimr
            ld      bvcnst, #cvtimr
            clrbit  trklec, crgmde      ;not trickle charge
            setbit  charge, crgmde      ;indicate we're really charging .if     nimh
            jsrl    getemp              ;returns the temperature in A
            add     a, #50              ;setup a delta T of 15C
            x       a, initemp          ;initial tempreture + 15C
            .endif jmp     sttrkl              ;fast charge starting point ; TRICKL puts the system in trickle charge mode
;
trklof:
            clrbit  charge, crgmde      ;make sure no charge active
            clrbit  trklec, crgmde      ;no longer in trickle charge mode
            setbit  crgled, portcd      ;turn off the charge led
            clrbit  blinkc, flashb
            jsr     t1off               ; so turn off the charge timers
            jsr     t2off
            clrbit  chrga, portlc       ; and timer output bits
            clrbit  chrgb, portgc
            jmp     dlypmd      ;**     ;initialize min and max trickl:
            jsrl    ckrbat              ;check if Rbat needs to be charged
;           ld      batcnt, #1          ;so we'll come back next time
trklon:
            bitif   nimhd, portcp       ;test battery contact
            jp      trkl00              ; could be NiCd or NiMH
```

```
                jp      trklof                  ;if NiMH detected then this is a old board trkl00:
                .if     nimh
                jsrl    getemp                  ;returns the temperature in A
                ifgt    a, #maxnih              ;don't charge if too hot
                jp      trklof                  ;don't charge NiMH with old board
                .endif clrbit  charge, crgmde          ; reset mode
                setbit  crgled, portcd          ;turn off the charge led
                bitif   acav, portcp            ;don't try to charge from batteries
                ret
                jsr     clrbsy                  ;clear battery detect
                bitif   bdt, portlp             ;is there a battery present
                ret                             ; nop if no battery present
                bitif   syson, flashb           ;is the cpu operating normally
                jp      trkl01                  ; then continue
                setbit  blinkc, flashb          ; else flash the charge led
trkl01:
                setbit  trklec, crgmde
sttrkl:
                ld      b, #transb
                ld      [b+], #mincrg           ;set small duty cycle to start
                ld      [b+], #00
                ld      [b+], #(maxcrg-mincrg)
                ld      [b], #00
                jsr     spwm2a                  ;start Bat A charging
                ld      b, #transb
                ld      [b+], #mincrg           ;set small duty cycle to start
                ld      [b+], #00
                ld      [b+], #(maxcrg-mincrg)
                ld      [b], #00
                jsr     spwm1a                  ;start Bat B charging xphase: jsrl    tloff                           ;force duty cycle (ontime) out of phase
                jsrl    t2off                   ;turn PWMs off
                setbit  txc0, cntrl             ;then reenable them
                jsrl    wait50                  ;try to put pulses out of phase
                setbit  txc0, t2cntrl           ;then re-enable it
                ret strslp:
                jsr     drvoff                  ;turn off the drive
                jsrl    dspof0                  ;turn off the display
                jsr     c20off                  ;turn off the 90C20
                jsr     sleep                   ;slow the clock
                ld      erc, #1                 ;setup to flash every two seconds
                ret chkac:
                ld      b, #ophigh
                clrbit  iom, [b]
                jsrl    puthi
```

```
            jsrl    clrbsy                  ;reset the latch
            ld      a, mode                 ;get the contents of the mode byte
            and     a, #lobat2+lobat3
            swap    a                       ;swap nibbles
            bitif   lobat1, mode
            or      a, #020
            bitif   bankb, oplow            ;test for active bank
            or      a, #08                  ;set bit 3 if bank B is selected
            bitif   acav, portcp            ;test for ac available
            jp      chkac1                  ; if AC not avail
            or      a, #acav
chkac1:
            bitif   swx, portgp             ;also check standby switch
            jp      chkac2
            or      a, #swx                 ;if switch is down
chkac2:
            bitif   bdt, portlp
            jp      chkac5                  ;Skip type determination if no battery
            or      a, #bdt bitif   nimhd, portcp           ;test Ni metal hydride contact .if     nimh
            jp      chkac3
            jp      chkac4                  ;if NiMH detected
chkac3:
            push    a                       ;save the current flag byte
            jsrl    getemp                  ;test the temperature
            ifgt    a, #4                   ; and allow for offset in COP A/D
            setbit  nihdet, batmsc          ;done this way to set flag with either
            pop     a                       ; temp or previous nimhd detect
            bitif   nihdet, batmsc
chkac4:
            .else
            jp      chkac5
            .endif
            or      a, #nimhd               ;set bit if contact made
chkac5:
            x       a, portd                ;put the flags in the D port
            except  sramw, 01F81            ;and write them to SRAM
            ld      a, oplow                ;get the state of OP Low
            x       a, portd                ; and put in the D port
            except  sramw, 01F82            ; then write to SRAM
            ld      a, ophigh               ;now get the high byte
            x       a, portd                ; and put it in the D port
            except  sramw, 01F83            ; then write to SRAM
            ret strflg:
            setbit  notrkl, mode            ;do not allow trickle charge
            jmpl    trklof                  ;turn off charger pmoff:
            clrbit  bdt, wken               ;disable BDT interrupt
```

```
        clrbit   stbyen, sysbyt          ;do not allow standby button
        setbit   flshmd, sysbyt
        ld       b, #ophigh
        clrbit   fetoff, [b]             ;turn on fet across power switch
        jmpl     puthi flash0:
        jsr      getlp
        ifeq     transb, #0
        jmp      pmoff
        setbit   bdt, wken               ;turn battery detect back on
        setbit   stbyen, sysbyt          ;reenable standby button
        clrbit   flshmd, sysbyt
        ld       b, #ophigh
        setbit   fetoff, [b]             ;turn fet back off
        jmpl     puthi ckrbat:
        ld       enad, #087              ;read rbat voltage
        ld       a, #L(sresti)           ;get rbat operation time
        jsrl     mle00
        ifgt     a, #min4/4              ;charge if used for more than 1 minute
        jp       ckac                    ;charge reserve battery if ac available
ckr00:
        nop                              ;delay for A/D conversion
        nop
        ld       a, adrslt               ;get the reserve voltage
        ld       enad, #0                ;Put A/D in low power mode
        ifgt     a, #vrmin               ;test for minimum allowed voltage
        ret
crgrbt:
        jmp      rbstrt ckac:
        ld       enad, #0                ;Put A/D in low power mode
        bitif    acav, portcp            ;Next test for AC power
        jp       ck2min                  ;2 minutes operation before charg from bat
        jp       crgrbt
ck2min:
        ifgt     a, #min4/2              ;if more than 2 minutes
        jp       crgrbt                  ; charge even if no AC
        jp       ckr00                   ; otherwise check voltage ; This routine will become master and write the data in TEMP to HT21 ctl reg 5
;
htctlw:

; first set IO_M~ to IO in OPH
        ld       b, #ophigh              ;point to the op register data storage
        setbit   iom, [b]                ; D port data = 10000000 for IO
        jsrl     puthi ld       x, #temp                ;pointer for data to be output
```

; next, set up DRQ5 in OPL
```
        ld      a, oplow            ;get the op register data
        x       a, portd            ; so we can retreive this later
        ld      a, portd            ; emulate a store instruction
        or      a, #drq5            ;set the drq5 bit in the register save data
        x       a, portd            ; D port data = 00000001 for DRQ5
        ld      b, #portcd
        clrbit  milsad, [b]         ; C0 = 0
        setbit  milstb, [b]         ; C1 = 1 (this starts the DREQ cycle)
```

; now look for DACK
```
        ckdack
```

; next, pull master high in OPL
```
        ld      b, #portd           ; point to the D port
        setbit  master, [b]         ; D port data = 00000011 for master*
        clrbit  milstb, portcd      ; close the OP Low register
```

; Set the HT21 index register
```
        ld      [b], #05            ;point to the sleep control register
        except  iow, 01ED
```

; write desired data to D port
```
        x       a, [x]              ;recover the data to output
        x       a, [b]              ; and store it in port D
```

; execute the io write exception cycle to port 01EFh (HT21 Control)
```
        except  iow, 01EF x       a, [x]              ;and recover original OP low
```

; clear DRQ and master*
```
        x       a, [b]              ; A contains the original OP Low value
        ld      b, #portcd          ; point back to port C
        setbit  milstb, [b]         ; turn off master mode
        clrbit  milstb, [b]
```

; now set IO_M~ to M in OPH
```
        ld      b, #ophigh          ;point to the op register data storage
        clrbit  iom, [b]            ;point to memory
        jmpl    puthi
``` cpuhld:
```
        ld      b, #portlp          ;point to the L port
        clrbit  cpuint, wkpnd       ;clear the interrupt pending flag
        bitif   cpuint, [b]         ;wait for the interrupt to be acknowledged
        jsrl    delay               ; by the host cpu
        jsr     chkact              ;test for I/O activity
        jp      cpuxit              ; if activity present don't stop cpu
        ld      a, oplow            ;get the op register data
        x       a, portd            ; so we can retreive this later
        ld      a, portd            ; emulate a store instruction
        or      a, #drq5            ;set the drq5 bit in the register save data
```

```
            x       a, portd              ; D port data = 00000001 for DRQ5
            ld      b, #portcd
            clrbit  milsad, [b]           ; C0 = 0
            setbit  milstb, [b]           ; C1 = 1 (this starts the DREQ cycle)

ckdack

; next, pull master high in OPL
            ld      b, #portd             ; point to the D port
            setbit  master, [b]           ; D port data = 00000011 for master*
            clrbit  milstb, portcd        ; close the OP Low register
            x       a, [b]                ; recover current OP Low settings
            x       a, oplow              ; and save
cpuxit:
            setbit  hldreq, mode          ;Tell interested parties about hold
            ld      b, #wkpnd
            clrbit  kbdint, [b]           ;Clear keyboard but not timer to start
            setbit  kbdint, wken
            setbit  cpuint, wken
            ret chkact:
            bitif   ioact, portgp         ;test for I/O activity
            jp      actxit                ; if active don't stop cpu
            retsk
actxit:
            jsrl    clrbsy                ;instead attempt to clear the flag
            ret clrold:
            jsrl    rstpmd                ;setup averages for main battery
            ld      a, batrv              ; and for the reserve
            ret drvofl:
            ld      hdcmd, #0E0           ;Enter standby command ; This routine will become master and write the data in hdcmd to the Hard disk ctl reg
;
iow1f7:

; first set IO_M~ to IO in OPH
            ld      b, #ophigh            ;point to the op register data storage
            setbit  iom, [b]              ; D port data = 10000000 for IO
            jsrl    puthi ld      x, #hdcmd             ;pointer for data to be output ; next, set up DRQ5 in OPL
            ld      a, oplow              ;get the op register data
            x       a, portd              ; so we can retreive this later
            ld      a, portd              ; emulate a store instruction
            or      a, #drq5              ;set the drq5 bit in the register save data
            x       a, portd              ; D port data = 00000001 for DRQ5
```

```
            ld      b, #portcd
            clrbit  milsad, [b]         ; C0 = 0
            setbit  milstb, [b]         ; C1 = 1 (this starts the DREQ cycle)

; now look for DACK
            ckdack

; next, pull master high in OPL
            ld      b, #portd           ; point to the D port
            setbit  master, [b]         ; D port data = 00000011 for master*
            clrbit  milstb, portcd      ; close the OP Low register except  ior, 03F6           ;read alternate status port
            x       a, [b]              ;save OP Low              **
            ld      a, #L(03F6)         ;to retreive io data
            jsrl    ior300
            ifbit   7, a                ;test disk busy status
            jp      hdbusy              ;try again later
            ifeq    pendng, #0          ;no delay
            jp      hdwrit
            drsz    pendng              ;else lets wait a while
            jp      hdexit
hdwrit:
            clrbit  hdpnd, lcdseq       ;operation complete
            x       a, [b]              ;recover registers for now **

; write desired data to D port
            x       a, [x]              ;recover the data to output
            x       a, [b]              ; and store it in port D ; execute the io write exception cycle to port 01F7h (HD Control)
            except  iow, 01F7 x       a, [x]              ;and recover original OP low

; clear DRQ and master*
            x       a, [b]              ; A contains the original OP Low value
hdexit:
            ld      b, #portcd          ; point back to port C
            setbit  milstb, [b]         ; turn off master mode
            clrbit  milstb, [b]

; now set IO_M~ to M in OPH
            ld      b, #ophigh          ;point to the op register data storage
            clrbit  iom, [b]            ;point to memory
            jsrl    puthi
            clrbit  hdcs0, wkpnd        ;so we don't interrupt again
            ret hdbusy:
            ld      a, lcdseq
            and     a, #%hdpnd          ;mask off pending bit
            ifeq    a, #0
            ld      pendng, #12         ;set the flag for 60 msec delay
```

```
        setbit    hdpnd, lcdseq
        jp        hdexit

; This routine waits for the hard disk to finish an operation
;
dskbsy:

; first set IO_M~ to IO in OPH
        ld        b, #ophigh              ;point to the op register data storage
        setbit    iom, [b]                ; D port data = 10000000 for IO
        jsrl      puthi ; next, set up DRQ5 in OPL
        ld        a, oplow                ;get the op register data
        x         a, portd                ; so we can retreive this later
        ld        a, portd                ; emulate a store instruction
        or        a, #drq5                ;set the drq5 bit in the register save data
        x         a, portd                ; D port data = 00000001 for DRQ5
        ld        b, #portcd
        clrbit    milsad, [b]             ; C0 = 0
        setbit    milstb, [b]             ; C1 = 1 (this starts the DREQ cycle)

; now look for DACK
        ckdack

; next, pull master high in OPL
        ld        b, #portd               ; point to the D port
        setbit    master, [b]             ; D port data = 00000011 for master*
        clrbit    milstb, portcd          ; close the OP Low register
dbusy:
        except    ior, 03F6               ;read alternate status port
        ld        a, #L(03F6)             ;to retreive io data
        jsrl      ior300
        ifbit     7, a                    ;test disk busy status
        jp        dbusy                   ;try again ld        a, oplow                ;and recover original OP low x         a, [b]                  ; A contains the original OP Low value
        ld        b, #portcd              ; point back to port C
        setbit    milstb, [b]             ; turn off master mode
        clrbit    milstb, [b]

; now set IO_M~ to M in OPH
        ld        b, #ophigh              ;point to the op register data storage
        clrbit    iom, [b]                ;point to memory
        jsrl      puthi
        clrbit    hdcs0, wkpnd            ;so we don't interrupt again
        ret tog:
        ld        b, #oplow
        setbit    lowbat, [b]             ;turn on the low batt LED
        jsrl      putlow
```

```
            ld      b, #portcd
            clrbit  crgled, [b]         ; also the charge LED
            clrbit  pwrled, [b]         ; and the power LED
            ret kildsp:
            ld      b, #oplow           ;set the OP low byte
            clrbit  lcdon, [b]          ; to turn off the backlight inverter
            clrbit  vddon, [b]          ; to turn off the +5v to the LCD
            jmpl    putlow togl:
            ld      b, #oplow
            setbit  lowbat, [b]         ;turn on the low batt LED
            jsrl    putlow
            ld      b, #portcd
            clrbit  crgled, [b]         ; turn the charge LED on
            setbit  pwrled, [b]         ; and the power LED off
            ret ;
; CHK1ST does a checksum of the first 100h locations in the program.
; This can be extended to check all of program memory by adding a
;       LAID
;       RET
; to every 100h block of memory, and then looping through each call
; 100h times as below.
;
chk1st:
            ld      b, #ophigh
            clrbit  iom, [b]            ;make sure we're set to memory cycle
            jsrl    puthi ld      cnt, #0             ;loop counter (must be a register)
            ld      ckadr, #0           ;address in the block
            ld      ckdata, #0AA        ;seed for checksum
ckloop:
            ld      a, ckadr ;get the current addresss to check
            inc     a                   ;increment for next time
            x       a, ckadr ;save the incremented value
            jsrl    cksm00              ;get the contents from the address in block 0
            add     a, ckdata           ;and add in the running total
            x       a, ckdata           ;store it back
            drsz    cnt                 ;do this 256 times
            jp      ckloop
            ld      a, ckdata           ;get the checksum
            x       a, portd ;to report to host
            except  sramw, 01f81        ;return checksum as 1st parameter
            ret lbbeep:
            bitif   lobat2, mode        ;override if already in low bat 2
            jp      nobeep
            drsz    avcnst
```

```
            ret
            ld      avcnst, #(seccnt/2)+1   ; for .5 seconds per beep
            jsrl    stbeep
            drsz    bvcnst                  ;do this 5 times
            ret
nobeep:
            clrbit  lblbep, flashb          ; and only 5 times
            ret ;This is a routine to test I/O writes to the host processor bus ; The X register is used to point to the Data to be output
; The B register points to Port D during the data transfer iow080:
; first set IO_M~ to IO in OPH
            ld      b, #ophigh              ;point to the op register data storage
            setbit  iom, [b]                ; D port data = 10000000 for IO
            jsrl    puthi ld      x, #temp                ;pointer for data to be output ; next, set up DRQ5 in OPL
            ld      a, oplow                ;get the op register data
            x       a, portd                ; so we can retreive this later
            ld      a, portd                ; emulate a store instruction
            or      a, #drq5                ;set the drq5 bit in the register save data
            x       a, portd                ; D port data = 00000001 for DRQ5
            ld      b, #portcd
            clrbit  milsad, [b]             ; C0 = 0
            setbit  milstb, [b]             ; C1 = 1 (this starts the DREQ cycle)

; now look for DACK ckdack

; next, pull master high in OPL
            ld      b, #portd               ; point to the D port
            setbit  master, [b]             ; D port data = 00000011 for master*
            clrbit  milstb, portcd          ; close the OP Low register ; write desired data to D port
            x       a, [x]                  ;recover the data to output
            x       a, [b]                  ; and store it in port D ; execute the io write exception cycle to port 80h
            except  iow, 080 x       a, [b]                  ;recover data
            x       a, [x]                  ;and return to temp while recovering A ; clear DRQ and master*
            x       a, [b]                  ; A contains the original OP Low value
            ld      b, #portcd              ; point back to port C
```

```
            setbit   milstb, [b]          ; turn off master mode
            clrbit   milstb, [b]

; now set IO_M~ to M in OPH
            ld       b, #ophigh           ;point to the op register data storage
            clrbit   iom, [b]             ;point to memory
            jmpl     puthi                ; and return testio:
            jsr      chkact               ;check for I/O activity
            jp       relhld               ;release hold if still active
            bitif    drq5, oplow          ;are we in hold already
            ret                           ; if so just return
;**         jsr      drvoff               ;make sure the drive is off
            jmp      cpuhld               ;lowest power mode
relhld:
            ld       b, #ophigh           ;point to the op register data storage
            setbit   iom, [b]             ; D port data = 10000000 for IO
            jsrl     puthi ld       b, #oplow            ;restore normal value
            clrbit   drq5, [b]
            clrbit   master, [b]
            jsrl     putlow
; now set IO_M~ to M in OPH
            ld       b, #ophigh           ;point to the op register data storage
            clrbit   iom, [b]             ;point to memory
            jmpl     puthi                ; and return ; FLASHC blinks the charge light by toggling it off/on once per second flashc:
            ld       b, #portcd
            bitif    crgled, [b]          ;is the LED off?
            jp       crglon               ; then turn it on
            setbit   crgled, [b]          ; else turn it off
            ret
crglon:
            clrbit   crgled, [b]
            ret ; FLASHP uses the counter ERC to flash the power LED .5 seconds
; on every 2 seconds flashp:
            jsr      testio               ;see if we're really in hold
            drsz     erc                  ;test the counter
            ret                           ;until underflow
            bitif    bdt, mode
            ld       bvcnst, #1           ;force beep
            bitif    poabep, flashb       ;should we beep
            jsrl     stbeep
            bitif    pwrled, portcp      ;test if light is off/on
            jp       pledon               ;if off then turn on
```

```
          setbit   pwrled, portcd       ;turn led off
          ld       erc, #0              ;off for approx 1.3 seconds
          bitif    lobat2, mode
          ret                           ;don't affect low bat led
          bitif    bdt, mode
          jp       lblon                ;turn on lowbat led
          ret
pledon:
          clrbit   pwrled, portcd       ;turn the led on
          ld       erc, #(seccnt/2)+1   ; for .5 seconds
          bitif    lobat2, mode
          ret                           ;don't affect low bat led
          bitif    bdt, mode
          jp       lbloff               ;turn off lowbat led
          ret lblon:
          bitif    lobat2, mode
          jsrl     setbep               ;beep if low bat 2 mode
          ld       b, #oplow
          setbit   lowbat, [b]
          jmpl     putlow lbloff:
          jsrl     stpbep
lblof0:
          ld       b, #oplow
          clrbit   lowbat, [b]
          jmpl     putlow ; FLSHLB uses the counter AVCNST to flash the low bat LED .5sec on every
; second.  This register is safe to use because we can't have a low
; battery condition while charging.

flshlb:
          drsz     avcnst               ;test the counter
          ret
          ld       avcnst, #(seccnt/2)+1 ; for .5 seconds
          bitif    lowbat, oplow        ;is the LED already on?
          jp       lbloff               ; then turn it off
          jp       lblon                ; else turn it on tstbat:
          ld       a, #07               ;set single & divide by 16, bank A
          bitif    bankb, oplow         ;if on bank B
          or       a, #040              ; setup to read battery B's voltage
          x        a, enad              ;and enable A/D converter
          ld       a, enad              ; retreive the enable command
          xor      a, #040              ; setup to read the other channel
          nop                           ;Time delay to complete conversion
          nop
          nop
          nop
          jsrl     delay1               ;10 more cop clocks delay
```

```
        x      a, enad              ;start the next cycle
        ld     a, adrslt ; get the previous value
        ld     b, #adrslt           ;delay and setup for compare
        nop
        nop
        nop
        nop
        jsrl   delay1               ;10 more cop clocks delay
        ld     enad, #0 ;Put A/D in low power mode
        rc                          ;clear the carry
        adc    a, #mindlt           ; and adjust for no load voltage
        ifgt   a, [b]               ;no load V must be greater then loaded V+delta
        ret                         ; or we won't switch
        retsk ; READV momentairly turns off the charger and rereads the battery voltages readv:   ;there is no need to turn any charger off before polloing voltage and current
        ld     enad, #07            ;start voltage reading for A batt
        ld     b, #enad
        ld     x, #transb           ;use the transb location to pass readings
        rc
        nop                         ;delay to wait for conversion to
        nop                         ; be complete
        nop
        nop
        nop
        nop
        nop
        nop
avlop:
        nop
        nop
        nop
        ld     a, [b]               ;get the enable command
        adc    a, #040              ;bump to the next channel
        x      a, [b+]              ; and start the next conversion
        adc    a, #080              ;to set the carry on the last reading
        ld     a, [b-]              ;read the previous result
        x      a, [x+]              ; and store it
        ld     a, [x+]              ;bump x to point to next channel
        ifnc                        ;test for overflow
        jp     avlop                ; and continue till done
        ld     enad, #0             ;Put A/D in low power mode ret testad:
        bitif  ampson, ophigh
        jp     tstadx
        ret
tstadx:
        ld     b, #batav            ;point to start of A/D value table
        ld     cnt, #8              ;eight entries
```

```
tstad0:
        ld      a, [b]                  ;get a value
        ifeq    a, #0FF                 ; and test for saturation
        setbit  adfail, batmsc          ;if failing set flag
        drsz    cnt
        jp      tstad0                  ;loop through all channels
        bitif   adfail, batmsc          ;if we failed
        ret
```

; These routines will handle timing the power up/down sequencing for the LCD

```
frstof:
        clrbit  onetik, [b]             ;first 5 msec is over
        jmp     c20off                  ; so assert pwrdwn* syncok:
        clrbit  sync, [b]               ;now the counter is in sync
        ret sequen:
        ld      b, #lcdseq              ;setup to test flags
        bitif   sync, [b]               ;syncronize with timer 0
        jp      syncok
        bitif   seqon, [b]
        jp      lcdson                  ;do turn on sequence
        bitif   seqoff, [b]
        jp      lcdoff
        bitif   hdpnd, [b]              ;test for hd routine pending
        ret
        ld      [b], #0                 ;if none of the above
        ret lcdoff:
        bitif   onetik, [b]             ;first 5 msec delay period
        jp      frstof
        drsz    pendng                  ;count down
        ret
        clrbit  seqoff, [b]
        ld      b, #oplow               ;point to the low byte
        clrbit  vddon, [b]              ; to turn off the +5v to the LCD
        jsrl    putlow                  ;do it and return to caller
        jsr     c20on                   ;turn the 90C20 back on
        bitif   dlycdn, lcdseq
        jp      clrcdn
        ret frston:
        clrbit  onetik, [b]             ;first 5 msec is over
        jmp     c20on                   ; so deassert pwrdwn* lcdson:
        bitif   onetik, [b]             ;first 5 msec delay period
        jp      frston
        drsz    pendng                  ;count down
```

```
        ret
        clrbit  seqon, [b]
        bitif   hdpnd, [b]          ;hard disk also?
        ld      pendng, #8          ;reset hd delay
        ld      b, #oplow           ;point to the low byte
        setbit  lcdon, [b]          ; to turn on the backlight inverter
        jsrl    putlow              ;do it and return to caller
        bitif   dlycdn, lcdseq
        jp      clrcdn
        ret clrcdn:
        clrbit  dlycdn, lcdseq
        ld      b, #ophigh
        clrbit  iom, [b]            ;make sure we're set to memory for CDONE
        jsrl    puthi
        rbit    ipnd, psw           ;reset external interrupt pending flag
        sbit    1, psw              ; enable external interrupt
        except  scdone, 0           ; set CDONE for the host
        ret ; CKSRAM will look for a A5h at address 1E02 to indicate that the SRAM
; data has been initialized. If it does not find the A5h it will clear
; the area between 1E02 and 1EFF, and then store an A5 at 1E02.

cksram:
        ld      a, #L(sinitf)       ;get lower byte of address
        jsrl    m1e00
        ifeq    a, #flgval
        ret
        ld      b, #ophigh
        clrbit  iom, [b]            ;make sure we're set to memory cycle
        jsr     puthi
        ld      portd, #0
        except  sramw, sresti
        except  sramw, srescr
        except  sramw, srescr+1
        except  sramw, sresdi
        except  sramw, sresdi+1
        except  sramw, dmy008
        except  sramw, dmy009
        except  sramw, dmy00A
        except  sramw, dmy00B
        except  sramw, dmy00C
        except  sramw, dmy00D
        except  sramw, dmy00E
        except  sramw, dmy00F
        except  sramw, dmy010
        except  sramw, dmy011
        except  sramw, dmy012
        except  sramw, dmy013
        except  sramw, dmy014
        except  sramw, dmy015
```

```
        except  sramw, dmy016
        except  sramw, dmy017
        except  sramw, dmy018
        except  sramw, dmy019
        except  sramw, dmy01A
        except  sramw, dmy01B
        except  sramw, dmy01C
        except  sramw, dmy01D
        except  sramw, dmy01E
        except  sramw, dmy01F
        except  sramw, dmy020
        except  sramw, dmy021
        except  sramw, dmy022
        except  sramw, dmy023
        except  sramw, dmy024
        except  sramw, dmy025
        except  sramw, dmy026
        except  sramw, dmy027
        except  sramw, dmy028
        ld      portd, #0FF             ;force initial charge of rbat
        except  sramw, sresti
        ld      portd, #flgval          ;area now initialized
        except  sramw, sinitf
        ret lbtst:
        bitif   acav, portcp            ;no low bat test if ac available
        jp      lbt0
        jmp     cmderr
lbt0:
        setbit  lbt, debug
        jp      sysext
cendt:
        setbit  cet, debug
sysext:
        setbit  dlycdn, lcdseq          ;to tell processor we have finished
        ret
actst:
        setbit  act, debug
        jp      sysext sysim0:
        jsr     getlp
        ld      a, transb
        ifeq    a, #0
        jp      snap                    ;take immediate image
        bitif   lbt, a                  ;is this a discharge test?
        jp      lbtst
        bitif   charge, crgmde          ;do not allow following tests unless
        jp      sysim1
        jmp     snap                    ;end of fast charge.  get last snap
sysim1:
        bitif   cet, a                  ;test at charge end?
```

```
            jp      cendt           ; then branch to apropriate test
            bitif   act, a          ;adjust charge?
            jp      actst
            jmp     cmderr snap:
            ld      b, #ophigh
            clrbit  iom, [b]        ;make sure we're set to memory cycle
            jsrl    puthi
;
            ld      x, #second      ;first do registers
            ld      b, #portd ld      a, [x+]         ;get a byte
            x       a, [b]          ;and put it in port D
            except  sramw, 01E80
            ld      a, [x+]         ;get a byte
            x       a, [b]          ;and put it in port D
            except  sramw, 01E81
            ld      a, [x+]         ;get a byte
            x       a, [b]          ;and put it in port D
            except  sramw, 01E82
            ld      a, [x+]         ;get a byte
            x       a, [b]          ;and put it in port D
            except  sramw, 01E83
            ld      a, [x+]         ;get a byte
            x       a, [b]          ;and put it in port D
            except  sramw, 01E84
            ld      a, [x+]         ;get a byte
            x       a, [b]          ;and put it in port D
            except  sramw, 01E85
            ld      a, [x+]         ;get a byte
            x       a, [b]          ;and put it in port D
            except  sramw, 01E86
            ld      a, [x+]         ;get a byte
            x       a, [b]          ;and put it in port D
            except  sramw, 01E87
            ld      a, [x+]         ;get a byte
            x       a, [b]          ;and put it in port D
            except  sramw, 01E88
            ld      a, [x+]         ;get a byte
            x       a, [b]          ;and put it in port D
            except  sramw, 01E89
            ld      a, [x+]         ;get a byte
            x       a, [b]          ;and put it in port D
            except  sramw, 01E8A
            ld      a, [x+]         ;get a byte
            x       a, [b]          ;and put it in port D
            except  sramw, 01E8B
            ld      a, [x+]         ;get a byte
            x       a, [b]          ;and put it in port D
            except  sramw, 01E8C
            ld      a, [x+]         ;get a byte
            x       a, [b]          ;and put it in port D
```

```
        except  sramw, 01E8D
        ld      a, [x+]         ;get a byte
        x       a, [b]          ;and put it in port D
        except  sramw, 01E8E
        ld      a, [x]          ;get a byte
        x       a, [b]          ;and put it in port D
        except  sramw, 01E8F
;
        ld      x, #ophigh      ;point to the data area ld      a, [x+]         ;get ophigh
        x       a, [b]          ;and put it in port D
        except  sramw, 01E90
        ld      a, [x+]         ;get oplow
        x       a, [b]          ;and put it in port D
        except  sramw, 01E91
        ld      a, [x+]         ;get saveb
        x       a, [b]          ;and put it in port D
        except  sramw, 01E92
        ld      a, [x+]         ;get savex
        x       a, [b]          ;and put it in port D
        except  sramw, 01E93
        ld      a, [x+]         ;get a byte
        x       a, [b]          ;and put it in port D
        except  sramw, 01E94
        ld      a, [x+]         ;get a byte
        x       a, [b]          ;and put it in port D
        except  sramw, 01E95
        ld      a, [x+]         ;get a byte
        x       a, [b]          ;and put it in port D
        except  sramw, 01E96
        ld      a, [x+]         ;get a byte
        x       a, [b]          ;and put it in port D
        except  sramw, 01E97
        ld      a, [x+]         ;get a byte
        x       a, [b]          ;and put it in port D
        except  sramw, 01E98
        ld      a, [x+]         ;get a byte
        x       a, [b]          ;and put it in port D
        except  sramw, 01E99
        ld      a, [x+]         ;get a byte
        x       a, [b]          ;and put it in port D
        except  sramw, 01E9A
        ld      a, [x+]         ;get a byte
        x       a, [b]          ;and put it in port D
        except  sramw, 01E9B
        ld      a, [x+]         ;get a byte
        x       a, [b]          ;and put it in port D
        except  sramw, 01E9C
        ld      a, [x+]         ;get a byte
        x       a, [b]          ;and put it in port D
        except  sramw, 01E9D
        ld      a, [x+]         ;get bbimin
        x       a, [b]          ;and put it in port D
```

```
except   sramw, 01E9E
ld       a, [x+]           ;get avwork
x        a, [b]                    ;and put it in port D
except   sramw, 01E9F
ld       a, [x+]           ;get a byte
x        a, [b]                    ;and put it in port D
except   sramw, 01EA0
ld       a, [x+]           ;get a byte
x        a, [b]                    ;and put it in port D
except   sramw, 01EA1
ld       a, [x+]           ;get a byte
x        a, [b]                    ;and put it in port D
except   sramw, 01EA2
ld       a, [x+]           ;get a byte
x        a, [b]                    ;and put it in port D
except   sramw, 01EA3
ld       a, [x+]           ;get a byte
x        a, [b]                    ;and put it in port D
except   sramw, 01EA4
ld       a, [x+]           ;get a byte
x        a, [b]                    ;and put it in port D
except   sramw, 01EA5
ld       a, [x+]           ;get mode
x        a, [b]                    ;and put it in port D
except   sramw, 01EA6
ld       a, [x+]           ;get a byte
x        a, [b]                    ;and put it in port D
except   sramw, 01EA7
ld       a, [x+]           ;get a byte
x        a, [b]                    ;and put it in port D
except   sramw, 01EA8
ld       a, [x+]           ;get a byte
x        a, [b]                    ;and put it in port D
except   sramw, 01EA9
ld       a, [x+]           ;get a byte
x        a, [b]                    ;and put it in port D
except   sramw, 01EAA
ld       a, [x+]           ;get a byte
x        a, [b]                    ;and put it in port D
except   sramw, 01EAB
ld       a, [x+]           ;get a byte
x        a, [b]                    ;and put it in port D
except   sramw, 01EAC
ld       a, [x+]           ;get bavmin
x        a, [b]                    ;and put it in port D
except   sramw, 01EAD
ld       a, [x+]           ;get a byte
x        a, [b]                    ;and put it in port D
except   sramw, 01EAE
ld       a, [x+]           ;get a byte
x        a, [b]                    ;and put it in port D
except   sramw, 01EAF
ld       a, [x+]           ;get alrmct
x        a, [b]                    ;and put it in port D
```

```
except  sramw, 01EB0
ld      a, [x+]         ;get a byte
x       a, [b]                  ;and put it in port D
except  sramw, 01EB1
ld      a, [x+]         ;get a byte
x       a, [b]                  ;and put it in port D
except  sramw, 01EB2
ld      a, [x+]         ;get ckdata
x       a, [b]                  ;and put it in port D
except  sramw, 01EB3
ld      a, [x+]         ;get smibyt
x       a, [b]                  ;and put it in port D
except  sramw, 01EB4
ld      a, [x+]         ;get lcdseq
x       a, [b]                  ;and put it in port D
except  sramw, 01EB5
ld      a, [x+]         ;get debug
x       a, [b]                  ;and put it in port D
except  sramw, 01EB6
ld      a, [x+]         ;get avsave0
x       a, [b]                  ;and put it in port D
except  sramw, 01EB7
ld      a, [x+]         ;get a byte
x       a, [b]                  ;and put it in port D
except  sramw, 01EB8
ld      a, [x+]         ;get a byte
x       a, [b]                  ;and put it in port D
except  sramw, 01EB9
ld      a, [x+]         ;get a byte
x       a, [b]                  ;and put it in port D
except  sramw, 01EBA
ld      a, [x+]         ;get a byte
x       a, [b]                  ;and put it in port D
except  sramw, 01EBB
ld      a, [x+]         ;get a byte
x       a, [b]                  ;and put it in port D
except  sramw, 01EBC
ld      a, [x+]         ;get a byte
x       a, [b]                  ;and put it in port D
except  sramw, 01EBD
ld      a, [x+]         ;get avsave7
x       a, [b]                  ;and put it in port D
except  sramw, 01EBE
ld      a, [x+]         ;get achrge0
x       a, [b]                  ;and put it in port D
except  sramw, 01EBF
ld      a, [x+]         ;get a byte
x       a, [b]                  ;and put it in port D
except  sramw, 01EC0
ld      a, [x+]         ;get a byte
x       a, [b]                  ;and put it in port D
except  sramw, 01EC1
ld      a, [x+]         ;get a byte
x       a, [b]                  ;and put it in port D
```

```
except  sramw, 01EC2
ld      a, [x+]         ;get a byte
x       a, [b]          ;and put it in port D
except  sramw, 01EC3
ld      a, [x+]         ;get a byte
x       a, [b]          ;and put it in port D
except  sramw, 01EC4
ld      a, [x+]         ;get a byte
x       a, [b]          ;and put it in port D
except  sramw, 01EC5
ld      a, [x+]         ;get a byte
x       a, [b]          ;and put it in port D
except  sramw, 01EC6
ld      a, [x+]         ;get bvsave0
x       a, [b]          ;and put it in port D
except  sramw, 01EC7
ld      a, [x+]         ;get a byte
x       a, [b]          ;and put it in port D
except  sramw, 01EC8
ld      a, [x+]         ;get a byte
x       a, [b]          ;and put it in port D
except  sramw, 01EC9
ld      a, [x+]         ;get a byte
x       a, [b]          ;and put it in port D
except  sramw, 01ECA
ld      a, [x+]         ;get a byte
x       a, [b]          ;and put it in port D
except  sramw, 01ECB
ld      a, [x+]         ;get a byte
x       a, [b]          ;and put it in port D
except  sramw, 01ECC
ld      a, [x+]         ;get a byte
x       a, [b]          ;and put it in port D
except  sramw, 01ECD
ld      a, [x+]         ;get a byte
x       a, [b]          ;and put it in port D
except  sramw, 01ECE
ld      a, [x+]         ;get bchrge0
x       a, [b]          ;and put it in port D
except  sramw, 01ECF
ld      a, [x+]         ;get a byte
x       a, [b]          ;and put it in port D
except  sramw, 01ED0
ld      a, [x+]         ;get a byte
x       a, [b]          ;and put it in port D
except  sramw, 01ED1
ld      a, [x+]         ;get a byte
x       a, [b]          ;and put it in port D
except  sramw, 01ED2
ld      a, [x+]         ;get a byte
x       a, [b]          ;and put it in port D
except  sramw, 01ED3
ld      a, [x+]         ;get a byte
x       a, [b]          ;and put it in port D
```

```
        except   sramw, 01ED4
        ld       a, [x+]         ;get a byte
        x        a, [b]                  ;and put it in port D
        except   sramw, 01ED5
        ld       a, [x+]         ;get a byte
        x        a, [b]                  ;and put it in port D
        except   sramw, 01ED6
        ld       a, [x+]         ;get rvsave0
        x        a, [b]                  ;and put it in port D
        except   sramw, 01ED7
        ld       a, [x+]         ;get a byte
        x        a, [b]                  ;and put it in port D
        except   sramw, 01ED8
        ld       a, [x+]         ;get a byte
        x        a, [b]                  ;and put it in port D
        except   sramw, 01ED9
        ld       a, [x+]         ;get a byte
        x        a, [b]                  ;and put it in port D
        except   sramw, 01EDA
        ld       a, [x+]         ;get a byte
        x        a, [b]                  ;and put it in port D
        except   sramw, 01EDB
        ld       a, [x+]         ;get a byte
        x        a, [b]                  ;and put it in port D
        except   sramw, 01EDC
        ld       a, [x+]         ;get a byte
        x        a, [b]                  ;and put it in port D
        except   sramw, 01EDD
        ld       a, [x+]         ;get a byte
        x        a, [b]                  ;and put it in port D
        except   sramw, 01EDE
        ld       a, [x+]         ;get transb0
        x        a, [b]                  ;and put it in port D
        except   sramw, 01EDF
        ld       a, [x+]         ;get a byte
        x        a, [b]                  ;and put it in port D
        except   sramw, 01EE0
        ld       a, [x+]         ;get a byte
        x        a, [b]                  ;and put it in port D
        except   sramw, 01EE1
        ld       a, [x+]         ;get a byte
        x        a, [b]                  ;and put it in port D
        except   sramw, 01EE2
        ld       a, [x+]         ;get a byte
        x        a, [b]                  ;and put it in port D
        except   sramw, 01EE3
        ld       a, [x+]         ;get a byte
        x        a, [b]                  ;and put it in port D
        except   sramw, 01EE4
        ld       a, [x+]         ;get a byte
        x        a, [b]                  ;and put it in port D
        except   sramw, 01EE5
        ld       a, [x+]         ;get a byte
        x        a, [b]                  ;and put it in port D
```

```
       except   sramw, 01EE6
       ld       a, [x+]              ;get a byte
       x        a, [b]               ;and put it in port D
       except   sramw, 01EE7
       ld       a, [x+]              ;get transb7
       x        a, [b]               ;and put it in port D
       except   sramw, 01EE8
;
       ld       x, #t2ralo           ;get the timer 2 pwm settings ld       a, [x+]              ;get t2ralo
       x        a, [b]               ;and put it in port D
       except   sramw, 01EE9
       ld       a, [x+]              ;get a byte
       x        a, [b]               ;and put it in port D
       except   sramw, 01EEA
       ld       a, [x+]              ;get t2rblo
       x        a, [b]               ;and put it in port D
       except   sramw, 01EEB
       ld       a, [x+]              ;get a byte
       x        a, [b]               ;and put it in port D
       except   sramw, 01EEC
;
       ld       x, #t1ralo           ;get timer 1 pwm settings ld       a, [x+]              ;get t1ralo
       x        a, [b]               ;and put it in port D
       except   sramw, 01EED
       ld       a, [x+]              ;get t1rahi
       x        a, [b]               ;and put it in port D
       except   sramw, 01EEE
;
       ld       x, #t1rblo ld       a, [x+]              ;get t1rblo
       x        a, [b]               ;and put it in port D
       except   sramw, 01EEF
       ld       a, [x]               ;get t1rbhi
       x        a, [b]               ;and put it in port D
       except   sramw, 01EF0 jsr      clrcdn
       ld       a, debug
       and      a, #0F8
       bitif    charge, crgmde
       ret
       ld       b, #ophigh           ;signal end of charge.
       clrbit   iom, [b]             ;make sure we're set to memory cycle
       jsrl     puthi ld       portd, #05A          ;indicate end of charge (for CRGMON)
       except   sramw, 01f80         ;replace original command
       ret
```

```
;
;************************************************
;        Instruction set checkout
;************************************************
;
instst:  ld      erc, #0    ;initialize error reference counter
;
; Section 1 - load memory locations with addresses.
;        This section utilizes all variations of the
;        load and exchange instructions.
;        Memory locations 010-01f are loaded with
;        their respective addresses.
;
         ld      010, #010
         ld      011, #011
         ld      b, #012
         ld      a, b
         x       a, [b]
         ld      a, [b+]
         inca
         x       a, [b+]
         ld      [b+], #014
         ld      [b], #015
         ld      A, #00A
         add     a, b
         ld      b, #01f
         x       a, [b]
         ld      a, [b-]
         deca
         x       a, [b]
         ld      a, [b]
         deca
         x       a, b
         ld      a, b
         x       a, [b-]
         ld      [b-], #01c
         ld      [b-], #01b
         ld      x, #01a
         ld      a, x
         x       a, [x]
         ld      a, [x-]
         deca
         x       a, [x-]
         ld      a, #002
         x       a, x
         sc
         subc    a, x
         rc
         x       a, x
         ld      a, x
         x       a, [x]
         ld      a, [x+]
         inca
```

```
        x       a, [x+]
        ld      a, #018
        x       a, [x+]
        ld      a, [x]
        ifeq    a, #019  ;result=019?
        sc
        drsz    erc
        ifnc
;       jmp     er1
;
er1:    jsr     atoc
e1:     jp      e1
er4:    jsr     atoc
e4:     jp      e4
er5:    jsr     atoc
e5:     jp      e5
er8:    jsr     atoc
e8:     jp      e8
er9:    jsr     atoc
e9:     jp      e9
er10:   jsr     atoc
e10:    jp      e10
er11:   jsr     atoc
e11:    jp      e11
er12:   jsr     atoc
e12:    jp      e12
er13:   jsr     atoc
e13:    jp      e13
er14:   jsr     atoc
e14:    jp      e14
        nop
er15:   jsr     atoc
e15:    jp      e15
er16:   jsr     atoc
e16:    jp      e16
er17:   jsr     atoc
e17:    jp      e17
er18:   jsr     atoc
e18:    jp      e18
er19:   jsr     atoc
e19:    jp      e19
er20:   jsr     atoc
e20:    jp      e20
er21:   jsr     atoc
e21:    jp      e21
er22:   jsr     atoc
e22:    jp      e22
er23:   jsr     atoc
e23:    jp      e23
er24:   jsr     atoc
e24:    jp      e24
er25:   jsr     atoc
e25:    jp      e25
er26:   jsr     atoc
```

```
e26:    jp      e26
er27:   jsr     atoc
e27:    jp      e27
er28:   jsr     atoc
e28:    jp      e28
er29:   jsr     atoc
e29:    jp      e29
er30:   jsr     atoc
e30:    jp      e30
er31:   jsr     atoc
e31:    jp      e31
er32:   jsr     atoc
e32:    jp      e32
;
; Error subroutine - Error number output to port 80h
;               Error data stored in SRAM at 1FC0h
;
Atoc:
        push    a
        ld      b, #ophigh
        clrbit  iom, [b]        ;make sure we're set to memory cycle
        jsrl    puthi
        pop     a x       a, portd ;setup error data
        except  sramw, 01FC0    ; and store in SRAM
        ld      a, erc          ;output error #
        x       a, temp         ; to port 80h
        jmp     iow080
;
;
; Section 13 - Multiply (16 x 16)
;
msetup: drsz    erc
        drsz    erc
        drsz    erc
        drsz    erc
        ld      a, #0cb
        ld      b, #0
        x       a, [b]
        ld      a, [b]
        ld      b, #3
        x       a, [b]
        ld      a, [b-]
        swap    a
        x       a, [b]
        ld      a, [b-]
        x       a, [b]
        jsr     mult
        drsz    erc
        ld      a, [b-]
        ifeq    a, #096
        jp      byp26
er49:   jsr     atoc
```

```
e49:    jp      e49
byp26:  drsz    erc
        ld      a, [b-]
        ifeq    a, #03f
        jp      byp27
er50:   jsr     atoc
e50:    jp      e50
byp27:  drsz    erc
        ld      a, [b-]
        ifeq    a, #09e
        jp      byp28
er51:   jsr     atoc
e51:    jp      e51
byp28:  drsz    erc
        ld      a, [b]
        ifeq    a, #014
        jp      nuinst
er52:   jsr     atoc
e52:    jp      e52
;
; Section 14 - Check new instructions
;
er53:   jsr     atoc
e53:    jp      e53
er54:   jsr     atoc
e54:    jp      e54
er55:   jsr     atoc
e55:    jp      e55
er56:   jsr     atoc
e56:    jp      e56 nuinst: ld      b, #0b
        ld      a, #0a

;
; COP 800 (16 x 16) multiply routine
;       Multiplicand in (1,0) multiplier in (3,2)
;       product in (5,4,3,2)
;
        cntr = 0f0
mult:   ld      cntr, #17
        ld      b, #4
        ld      [b+], #0
        ld      [b], #0
        ld      x, #0
        rc
mloop:  ld      a, [b]
        rrc     a
        x       a, [b-]
        ld      a, [b]
        rrc     a
        x       a, [b-]
        ld      a, [b]
```

```
            rrc     a
            x       a, [b-]
            ld      a, [b]
            rrc     a
            x       a, [b]
            ld      b, #5
            ifnc
            jp      test
            rc
            ld      b, #4
            ld      a, [x+]
            adc     a, [b]
            x       a, [b+]
            ld      a, [x-}
            adc     a, [b]
            x       a, [b]
test:       drsz    cntr
            jp      mloop
            ret
```

; The XSUMP routine checksums the system parameter data area to validate
; the initial settings in case of a total system power failure that
; causes the COP setings to be invalid

```
xsump:
            clr     a
            ld      x, #systim
            ld      b, #temp
            x       a, [b]              ;Clear the accumulator
            ld      cnt, #4
xslop:
            ld      a, [x+]             ;Get the parameter
            add     a, [b]              ; and add it to the accumulator
            x       a, [b]              ;save it back
            drsz    cnt
            jp      xslop
            ld      a, [b]              ;return with calculated checksum in A
            ret                         ; X points to stored checksum
```

; GET1P gets 1 parameter to the data location transb for test purposes

```
get4p:
            ld      cnt, #4
            jp      getp
get1p:
            ld      cnt, #1
getp:
            ld      x, #transb
            jmp     gvparm setbep:
            drsz    bvcnst              ;beep twice every 5 seconds
```

```
            ret
            ld      bvcnst, #1
            jp      stbeep beep5:
            ld      bvcnst, #4              ;to beep 4 more times after first
            ld      avcnst, #(seccnt/2)+1   ; for .5 seconds per beep
            setbit  lb1bep, flashb          ;set flag
            jp      stbeep                  ;do first beep stpbep:
            drsz    bvcnst
            ret
            ld      bvcnst, #9              ;wait 4.5 more seconds
;           jp      stbeep                  ; and fall through to beep routine stbeep:
            jsr     t2off                   ;make sure charger is off completly
            clrbit  chrga, portlc           ; so we can use this timer
            jsr     t1off                   ;this timer is duration
            clrbit  chrgb, portgc
            bitif   acav, portcp            ;test for ac available
            jp      stbep0                  ;jump if no AC
            rbit    intr, t2cntrl           ;make sure beep interrupts are disabled
            rbit    1, t2cntrl
            rbit    intr, icntrl            ;disable interrupts until the next beep
            rbit    1, icntrl
            ld      b, #ophigh
            clrbit  speakr, [b]             ;turn off the speaker
            jmp     puthi
stbep0:
            ld      b, #t2ralo              ;point to timer reload registers
            ld      [b+], #L(beepct-1)
            ld      [b+], #H(beepct-1)
            ld      [b+], #L(beepct-1)
            ld      [b], #H(beepct-1)
            ld      b, #t1ralo
            ld      [b+], #L(btime)
            ld      [b], #H(btime)
            ld      t2cntrl, #095           ;start the timer
            ld      cntrl, #090
            rbit    1, icntrl               ;clear the pending flag
            bitif   lobat3, mode
            ret                             ;dont turn off
            sbit    intr, icntrl            ; and enable the interrupt
            ret ;
; Decrement the various timeout counters
;
deccnt:
            ld      second, #seccnt         ;reset the seconds counter
            bitif   bdt, mode               ;test for operation on reserve
```

```
            jp      dec0            ; and skip decrement of tdelay except in tstnew
            ifeq    tdelay, #0      ;test new battery delay
            jp      dec0
            drsz    tdelay
            jp      dec0            ;wait to initialize
            bitif   initdc, batmsc  ;is this the first reading after a new battery
            jsr     rstpmd          ; then reset voltage readings
            jsr     resof0          ; including averages
dec0:
            bitif   rbin, portcd    ;is the reserve battery inactive?
            jp      dec00
            jsr     incrti          ; then increment reserve operation time
dec00:
            bitif   flshmd, sysbyt  ;don't check timeouts if flash active
            ret
            drsz    minute          ;decrement the minute counter
            jp      dec01           ; until the minute is up
            ld      minute, #min1   ;reset the minute counter
            bitif   bdt, mode       ;two minutes on reserve battery?
            jmp     spmoff          ; then turn off system
            bitif   lobat3, mode    ;10 seconds at cutoff level?
            jmp     spmoff          ; then turn off system
            jsr     decmin          ; then do our once a minute stuff
dec01:
            bitif   poa, flashb     ;don't do this again if already closed
            jp      dec01a
            bitif   stdeb2, flashb  ;We don't need to look unless switch is down
            jsr     tstpoa          ;check for case closed
dec01a:
            bitif   rbin, portcd
            jsr     readad          ;make new readings once per second
            bitif   charge, crgmde  ;are we charging the batteries?
            jmp     adjcrg          ; if so then check for end, etc.
            bitif   blinkc, flashb  ;Should we blink the charge light?
            jmpl    flashc          ; then do it
            ld      a, sysbyt       ;to speed up checks bitif   acav, portcp    ;test for ac available
            jp      dec02           ;jmp if no AC
            ld      batcnt, #min1   ;reset battery timer and don't switch
            setbit  initdc, batmsc  ; also signal PM for initial bat switch
            bitif   acovrd, a       ;test for AC override
            jmp     stmout          ; and reset timeout counters if active
dec02:
            bitif   hdsec, a        ;is the hd timeout in seconds?
            jsr     rldhdc          ;reset the hard disk timeout
            ld      a, sysbyt       ;to speed up checks
            bitif   lcdsec, a       ;is lcd T.O. in seconds
            jsr     rldlcd
            ld      a, sysbyt       ;to speed up checks
            bitif   syssec, a       ;is system T.O. in seconds
            jsr     rldsys
            bitif   acav, portcp    ;test for ac available
            jp      dec03           ;jmp if no AC
```

```
            ret
dec03:
            ifeq    tdelay, #0         ;don't test batteries until after delay
            jsr     chklow
            bitif   lobat2, mode       ;don't change batteries if in lobat 2 mode
            ret
            bitif   bdt, mode          ;don't change batteries if waiting for new bat
            ret
            drsz    batcnt             ;# of seconds to change batteries
            ret
            jsr     cngbat
            ret                        ; to allow for a skip return if no error
            ret ; TSTSTB tests the standby button to see if the user is requesting
; standby mode tststb:
            ld      b, #flashb
            bitif   swx, portgp        ;is the standby switch depressed?
            jp      tsts01             ; low true so, if not pressed, check for release
            bitif   stdeb1, [b]        ;check debounce bit
            jp      tsts00
            setbit  stdeb1, [b]
            ret
tsts00:
            bitif   stdeb2, [b]
            ret
            setbit  stdeb2, [b]
            bitif   stbyen, sysbyt     ;is the standby switch enabled?
            bitif   crton, flashb      ;is the crt in use
            ret                        ; then just return
            jmp     dspof0             ;otherwise we'll turn off the lcd
tsts01:
            bitif   stdeb2, [b]
            jp      tsts02
            clrbit  stdeb1, [b]
            ret
tsts02:
            bitif   hldreq, mode       ;are we already in standby?
            jp      exstby             ; then exit
            bitif   poa, [b]           ;was the case closed?
            jp      exstby             ; then don't enter standby when opened
            clrbit  stdeb1, [b]
            clrbit  stdeb2, [b]
            ld      alrmct, #0         ;switch is up, so clear count
            clrbit  poa, [b]
            bitif   stbyen, sysbyt     ;is the standby switch enabled?
            jmpl    stndby
            ret                        ;otherwise do nothing exstby:
```

```
        clrbit    stdeb2, [b]
        clrbit    stdeb1, [b]
        ld        alrmct, #0              ;switch is up, so clear count
        clrbit    poa, [b]
        clrbit    poabep, [b]
        jsr       hldoff                  ;bring cpu out of hold
        ret
;
;
;Noise is considered any glitch, within 1 sec., that is 2 units or greater
;in magnitude.  A/D readings are not allowed to increment or decrement more
;than one unit per second to overcome any glitch in the line.  This
;algorithm is not applied when PWM is stepped
;
adjnois:
        ld        a, hdcnt
        ifne      a, #1                   ;1 indicates that we didn't step recently
        jp        bnoise                  ;since we just steped PWM on bank A
        ld        b, #avsave              ;A voltage array
        jsr       donoise
        ld        b, #achrge              ;A current array
        jsr       donoise
bnoise: ld        a, lcdcnt
        ifne      a, #1                   ;1 indicates that we didn't step recently
        ret                               ;since we just steped PWM on bank B
        ld        b, #bvsave              ;B voltage array
        jsr       donoise
        ld        b, #bchrge              ;B current array
donoise:
        ld        a, [b+]
        ld        a, [b-]                 ;A ptr to previous sec. B ptr to current sec.
        ifeq      a, [b]                  ;nothing changed
        ret
        ifgt      a, [b]                  ;-delta
        jp        negnois
        inc       a                       ;allow one increment per second, only
        jp        extnois
negnois:
        dec       a
extnois:x         a, [b]                  ;allow one decrement per second, only
        ret ;Power up & reset variable and state initialization
;
Init:
        ld        pendng, #00             ;no delayed operations to start
        ld        debug, #0
        ld        lcdseq, #0
        ld        mode, #0
        ld        crgmde, #0
        ld        flashb, #crton
```

```
        ld      alrmct, #0
        ld      tdelay, #12         ;delay 12 seconds before checking low bat
        ld      batcnt, #min1       ;first battery change in 1 minutes
        ld      batmsc, #initdc     ;signal first operation ld      portcc, #0
        ld      portcd, #0
        ld      portlc, #0
        ld      portld, #0
        ld      portgc, #0
        ld      portgd, #0
        ld      enad, #0            ;Put A/D in low power mode ld      second, #seccnt     ;initialize timeout
        ld      minute, #min1 bitif   bdt, portlp         ;was the battery removed while we were off?
        clrbit  charge, batmsc      ;**
        ret
;—————————————————————————————————————————

.=01E00
m1e00:
        laid                        ;Allow COP to store parameters
        ret                         ; at 1E02-1EFF .=01F00                     ;place this at the top of SRAM ; The GETCMD routine will return the value of a command
; placed at address 1F80h by the host CPU. The COP can
; then call GSPARM or GVPARM to retreive the parameters
; to an area in the data ram of the COP processor
;
; On Entry:
;
;       CNT contains the number of parameters to retreive
;
; for GVPARM
;
;       X contains the address to store the parameters in COP data space
;
; On Exit:
;
;       The PSAVE area contains the parameters getcmd:
        ld      a, #080             ;Address of command on this page
        laid                        ; get contents of 1F80h
        ret gsparm:
        ld      x, #psave           ;point to the COP parameter area
gvparm:
        ld      b, #temp            ;temporary storage
```

```
        ld    [b], #081        ;address of parameters in SRAM
ploop:
        ld    a, [b]           ;address of current parameter
        laid                   ; get parameter
        x     a, [x+]          ; and store it in data space
        x     a, [b]           ;get address
        inc   a                ; and bump it
        x     a, [b]           ; then put it back for next time
        drsz  cnt              ;decrement the counter
        jp    ploop            ; and continue till done
        ret
```

What is claimed is:

1. A method for detecting a low charge state of a battery connected to a load for supplying power thereto, the method comprising:

measuring a change in the operating voltage of said battery occurring responsive to a change in the power consumption of said load;

measuring a change in the current through said load occurring responsive to said change in load power consumption;

computing a ratio of said battery voltage change to said load current change;

comparing said ratio to a preselected threshold value; and issuing a user warning signal indicating a low battery when said ratio exceeds said preselected threshold value.

2. The method of claim 1 further comprising effecting said change in load power consumption by periodically disconnecting said battery from said load.

3. The method of claim 1 wherein said preselected threshold value corresponds to an estimated value of the impedance of said battery occurring at a selected safe time period just prior to failure of said battery.

4. The method of claim 2 wherein said load is a variable load and said change in load power consumption is due to normal variations therein.

5. The method of claim 4 wherein said load is a portable personal computer.

6. A method for detecting a low charge state of a first battery connected to a load for supplying power to the load, the method comprising:

measuring a change in the operating voltage of said first battery occurring responsive to a change in the power consumption of said load;

measuring a change in the current through said load occurring responsive to said change in load power consumption;

computing a ratio of said first battery voltage change to said load current change;

comparing said ratio to a preselected threshold value;

issuing a user warning signal indicating a low battery when said ratio exceeds said threshold value; and disconnecting said first battery from said load and connecting a second battery thereto when said ratio exceeds said preselected threshold value.

7. The method of claim 6 wherein said preselected threshold value corresponds to an estimated value of the impedance of said first battery occurring at a selected safe time period just prior to failure of said first battery.

8. The method of claim 6 wherein said load is a portable personal computer.

9. Apparatus for detecting a low charge state of a battery supplying operating power to a load, the apparatus comprising:

a device connected to said battery for measuring the operating voltage of said battery;

a device means connected to said load for measuring the current through said load;

a voltage difference monitor connected to said voltage measuring device for monitoring a change in the battery voltage of said battery occurring responsive to a change in the power consumption of said load;

a current difference monitor connected to said current measuring device for monitoring a change in the load current occurring responsive to said change in load power consumption; and a control circuit connected to said voltage and current difference monitors for computing a ratio of said operating voltage change to said load current change and for issuing a control signal when said ratio exceeds a preselected threshold value.

10. The apparatus of claim 9 further comprising a signal generation circuit connected to said control circuit for issuing a user warning signal responsive to receipt of said control signal from said control circuit.

11. The apparatus of claim 9 wherein said preselected threshold value corresponds to an estimated value of the impedance of said battery occurring at a selected safe time period just prior to failure of said battery.

12. The apparatus of claim 9 wherein said load is a variable load and said change in load power consumption is due to a normal variation in said load.

13. The apparatus of claim 9 wherein said load is a portable personal computer.

14. The apparatus of claim 9 further comprising a switch circuit for periodically disconnecting said battery from said load for artificially effecting said change in load power consumption.

15. Apparatus for electrically disconnecting a first battery from a load and electrically connecting a second battery thereto upon detecting a low charge state of said first battery, the apparatus comprising:

a device connected to said battery for measuring the operating voltage of said battery;

a device means connected to said load for measuring the current through said load;

a voltage difference monitor connected to said voltage measurement device for monitoring a change in the operating voltage of said battery occurring responsive to a change in the power consumption of said load;

a current difference monitor connected to said current measurement device for monitoring a change in the current through said load occurring responsive to said change in said load power consumption;

a control circuit connected to said voltage and current difference monitors for computing a ratio of said operating voltage change to said load current change and issuing a control signal when said ratio exceeds a preselected threshold value; and a switch circuit connected to said control circuit for electrically disconnecting said first battery from said load and electrically connecting said second battery to said load responsive to said control signal.

16. The apparatus of claim 15 wherein said preselected threshold value corresponds to an estimated value of the impedance of said battery occurring at a selected safe time period just prior to failure of said battery.

17. The apparatus of claim 15 wherein said load is a variable load and said change in load power consumption is a normal variation in said load.

18. The apparatus of claim 15 wherein said load is a portable personal computer.

* * * * *